United States Patent
Tschumakow et al.

(10) Patent No.: US 10,354,917 B2
(45) Date of Patent: Jul. 16, 2019

(54) METHOD FOR MANUFACTURING ETCH STOP AREAS FOR CONTACTING SEMICONDUCTOR DEVICES

(71) Applicant: Infineon Technologies AG, Neubiberg (DE)

(72) Inventors: Dmitri Alex Tschumakow, Dresden (DE); Claus Dahl, Dresden (DE)

(73) Assignee: Infineon Technologies AG (DE)

( * ) Notice: Subject to any disclaimer, the term of this patent is extended or adjusted under 35 U.S.C. 154(b) by 35 days.

(21) Appl. No.: 15/787,855

(22) Filed: Oct. 19, 2017

(65) Prior Publication Data

US 2018/0114724 A1    Apr. 26, 2018

(30) Foreign Application Priority Data

Oct. 21, 2016   (DE) ........................ 10 2016 220 749

(51) Int. Cl.

| H01L 21/768 | (2006.01) |
|---|---|
| H01L 29/10 | (2006.01) |
| H01L 29/66 | (2006.01) |
| H01L 23/522 | (2006.01) |
| H01L 29/08 | (2006.01) |
| H01L 29/737 | (2006.01) |
| H01L 29/06 | (2006.01) |

(52) U.S. Cl.
CPC .. *H01L 21/76897* (2013.01); *H01L 21/76832* (2013.01); *H01L 21/76834* (2013.01); *H01L 23/5226* (2013.01); *H01L 29/0653* (2013.01); *H01L 29/0817* (2013.01); *H01L 29/1004* (2013.01); *H01L 29/66242* (2013.01); *H01L 29/7371* (2013.01)

(58) Field of Classification Search
None
See application file for complete search history.

(56) References Cited

U.S. PATENT DOCUMENTS

| 6,362,066 B1 * | 3/2002 | Ryum | ............... H01L 29/66242 257/565 |
|---|---|---|---|
| 2005/0236645 A1 | 10/2005 | Khater et al. | |

(Continued)

FOREIGN PATENT DOCUMENTS

| DE | 198 46 063 A1 | 4/2000 |
|---|---|---|
| DE | 100 30 391 A1 | 1/2002 |

*Primary Examiner* — Herve-Louis Y Assouman
(74) *Attorney, Agent, or Firm* — Design IP

(57) ABSTRACT

A method for manufacturing includes providing a semiconductor substrate having a semiconductor device including at least two device layers to be contacted. A first device layer is smaller than a lithographic minimum feature size used for manufacturing the semiconductor device. Further, the method includes providing an isolation layer on the semiconductor device such that the semiconductor device is covered by the isolation layer; planarizing the isolation layer up to the semiconductor device; providing a first lithographic mask on the semiconductor device, such that the first device layer and a portion of the isolation layer are covered by the first lithographic mask; selectively removing the isolation layer to expose a second device layer while maintaining the portion of the isolation layer that is covered by the first lithographic mask; and providing a stop layer on the first device layer, the second device layer and the portion of the isolation layer.

18 Claims, 20 Drawing Sheets

(56) References Cited

U.S. PATENT DOCUMENTS

2012/0091509 A1* 4/2012 Liu ................... H01L 29/0821
 257/197
2013/0187198 A1* 7/2013 Camillo-Castillo ......................
 H01L 29/417
 257/197

* cited by examiner

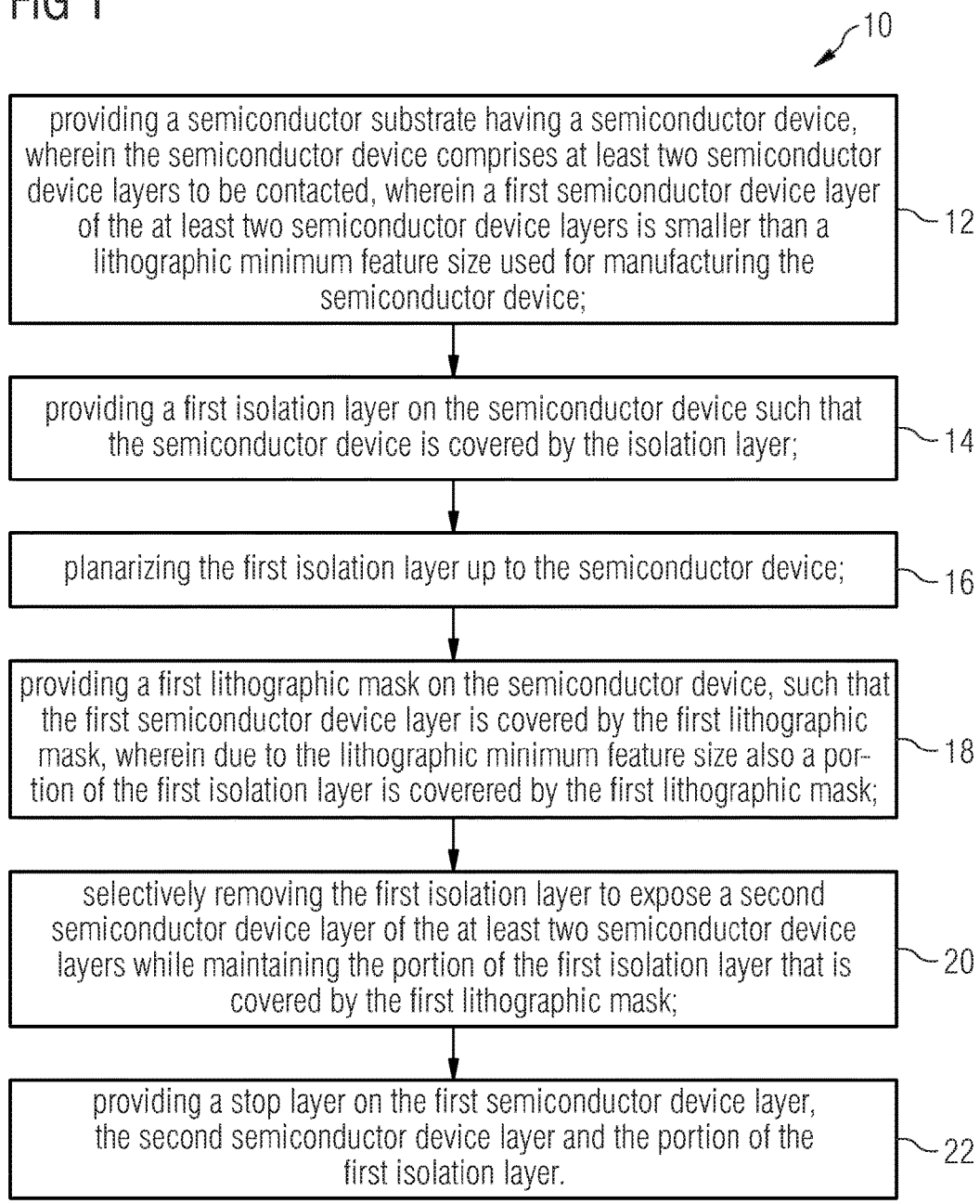

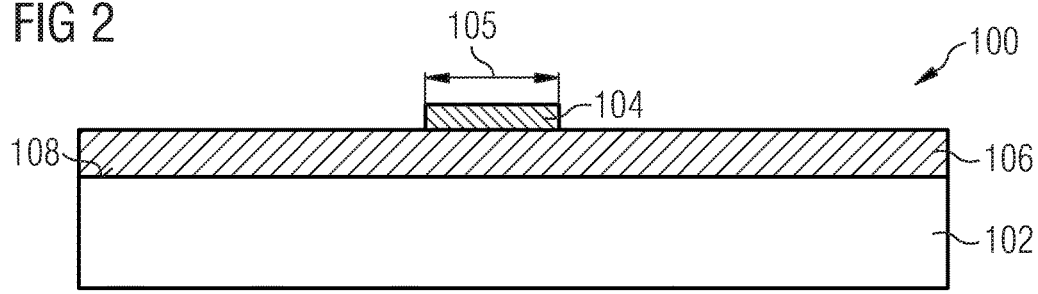
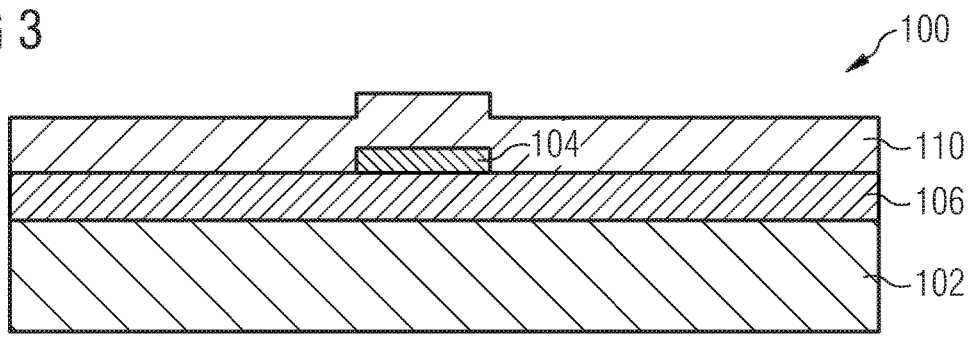
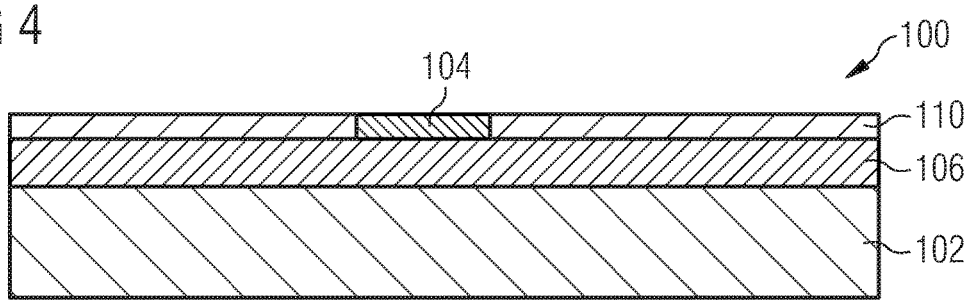
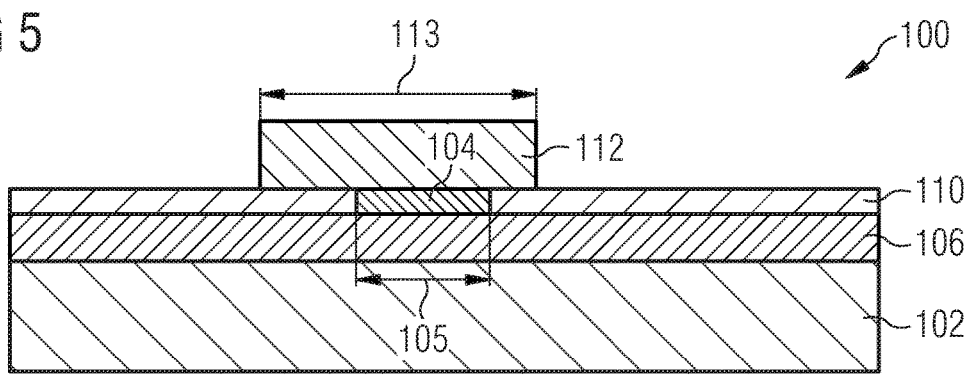

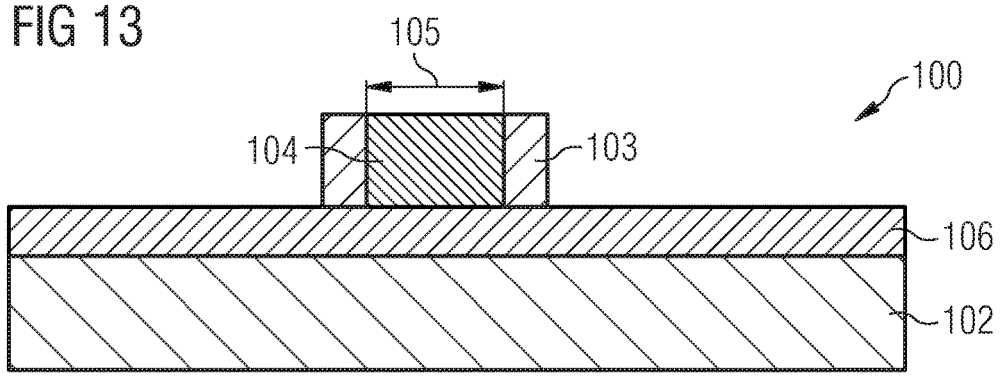
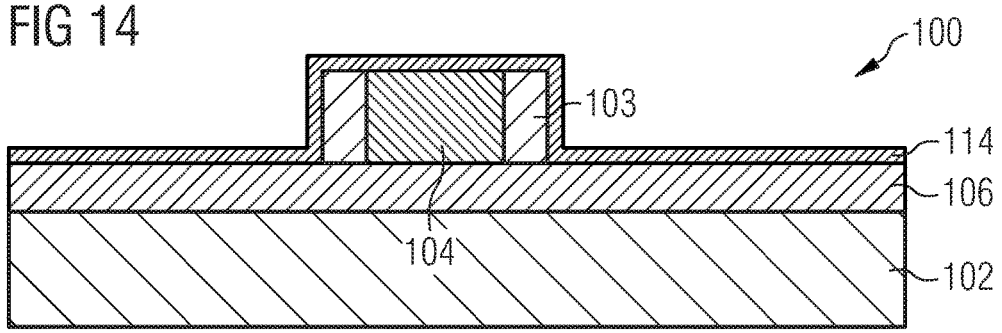
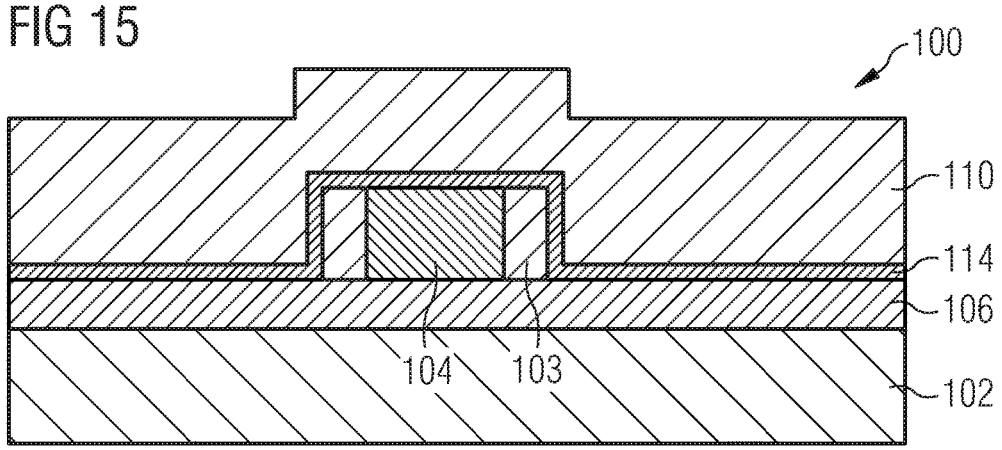

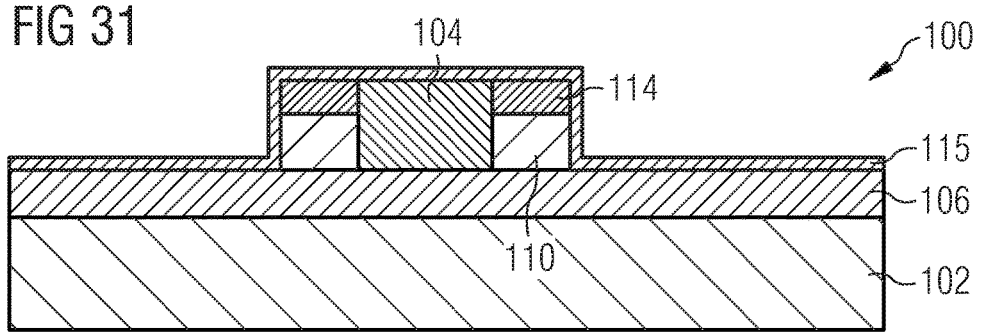
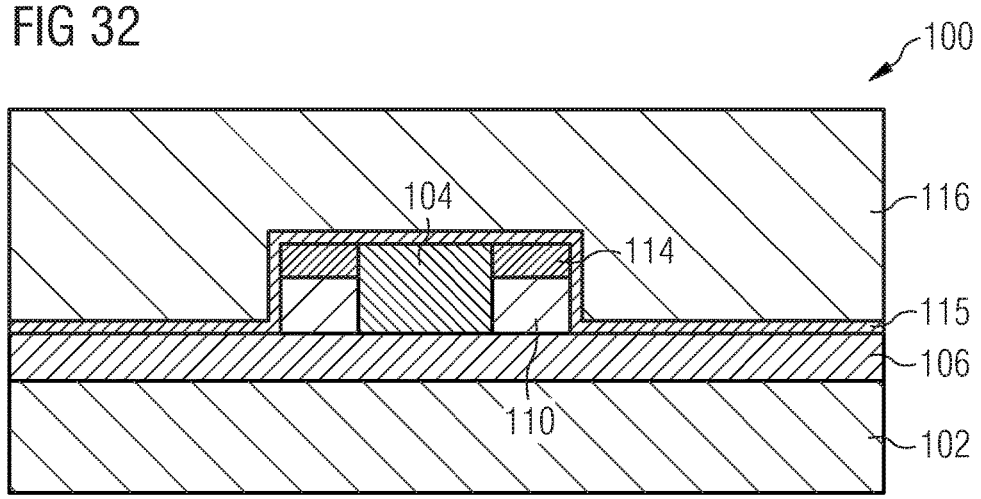
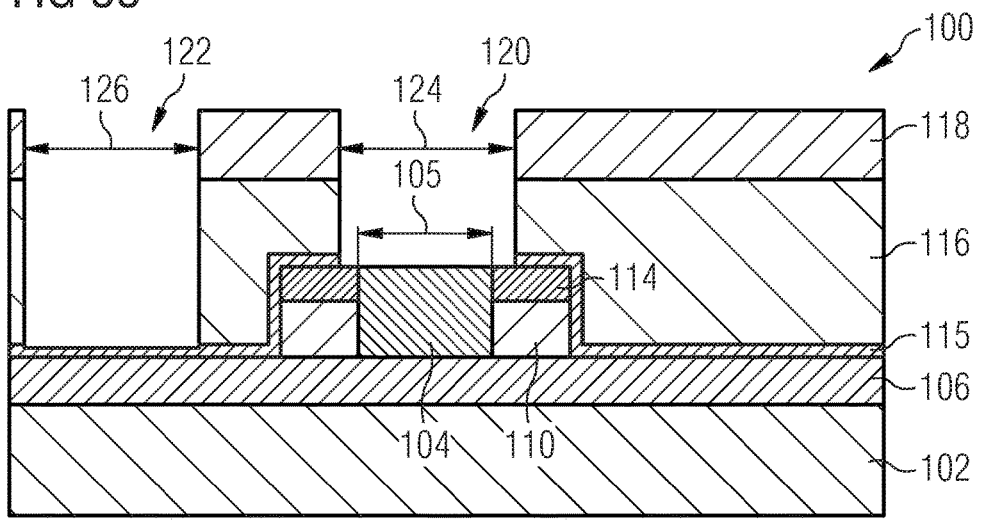

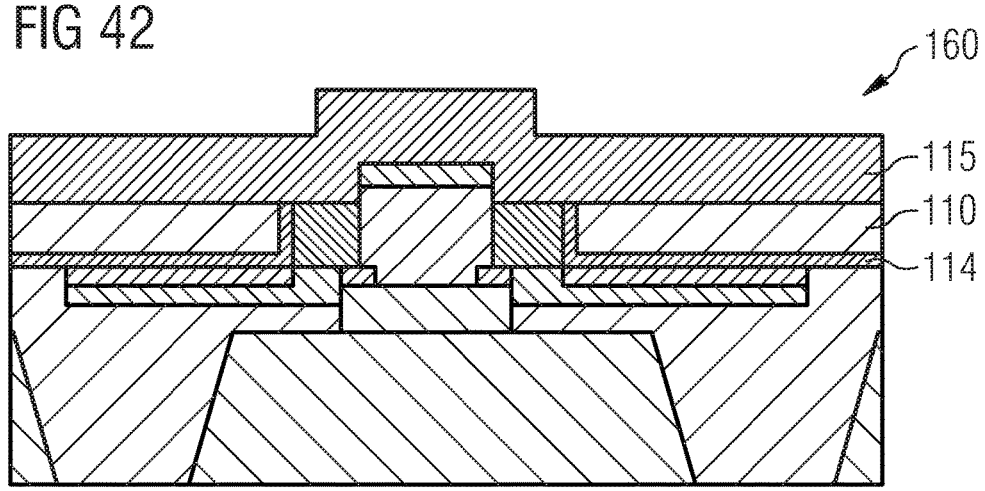
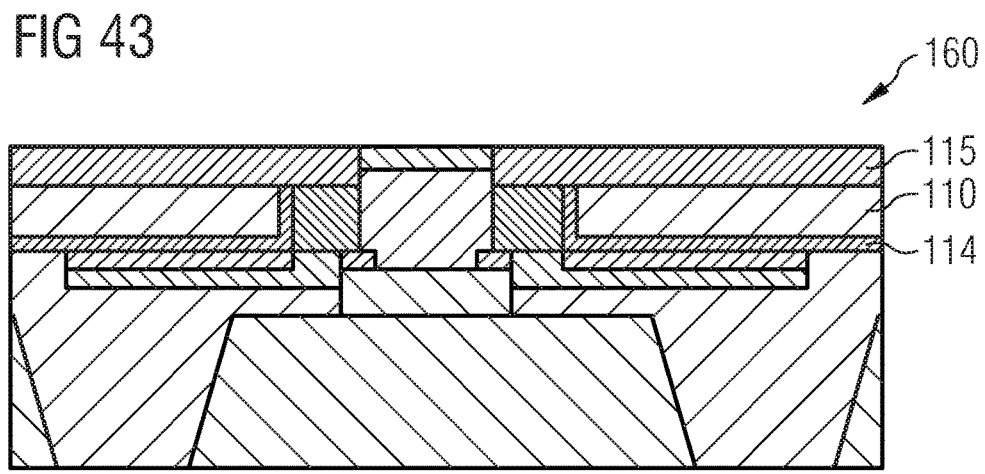
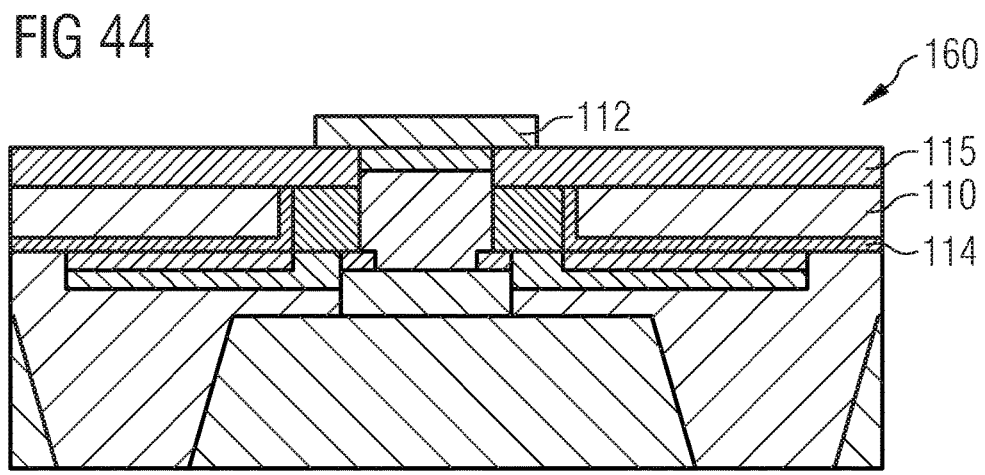

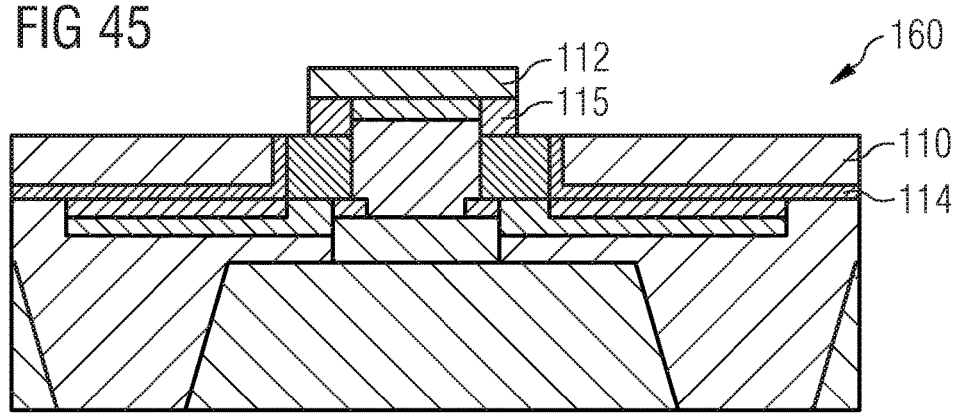
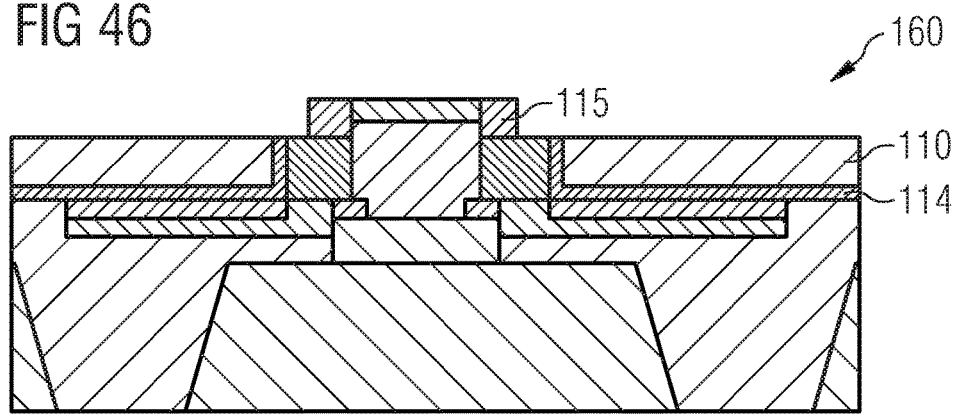
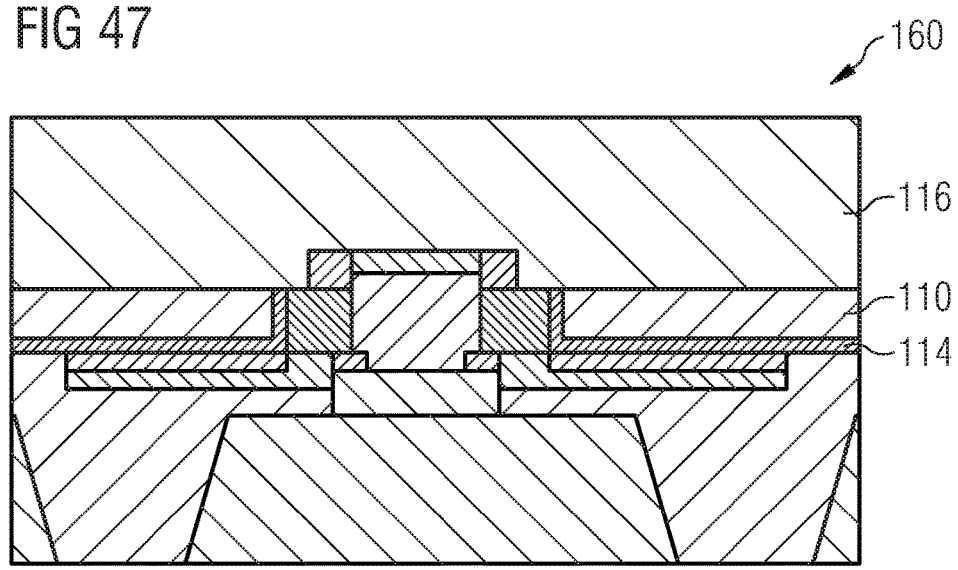

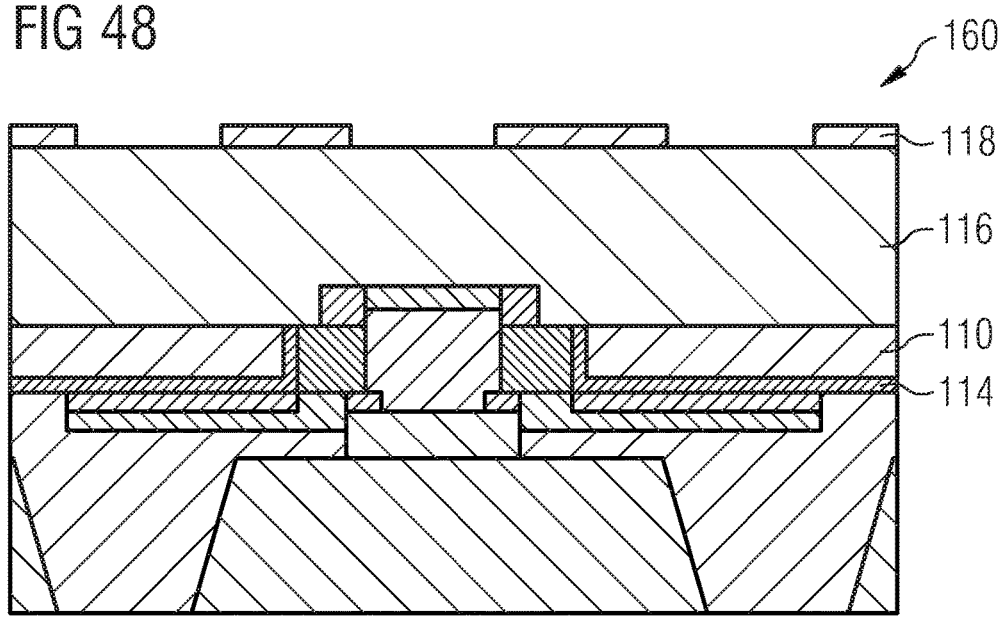
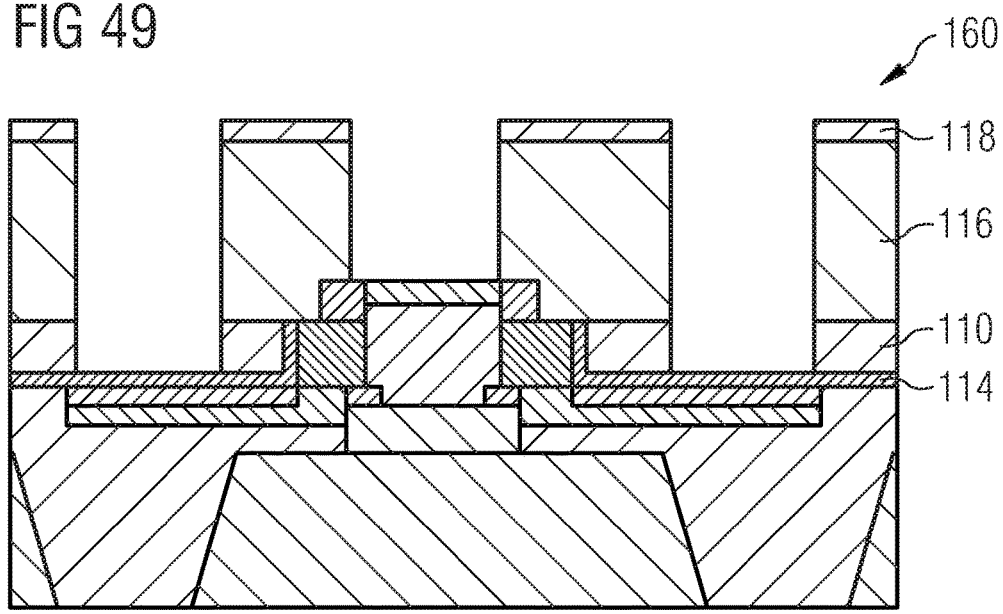

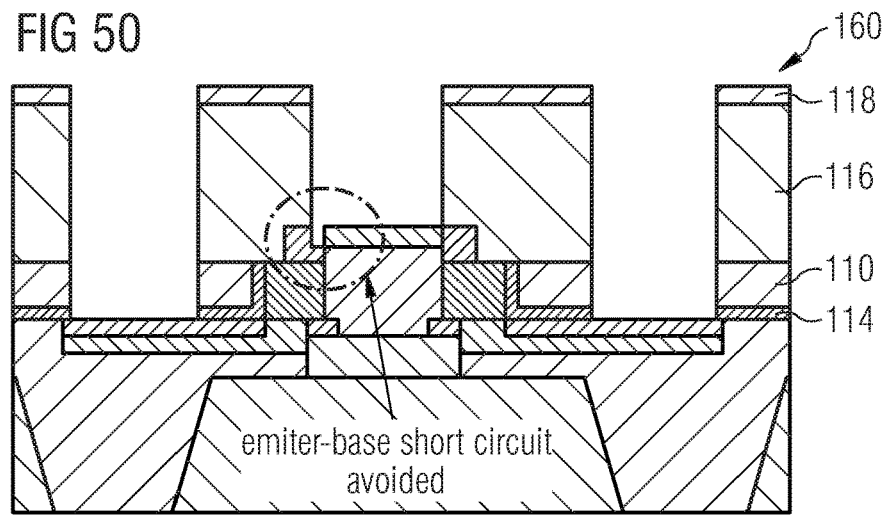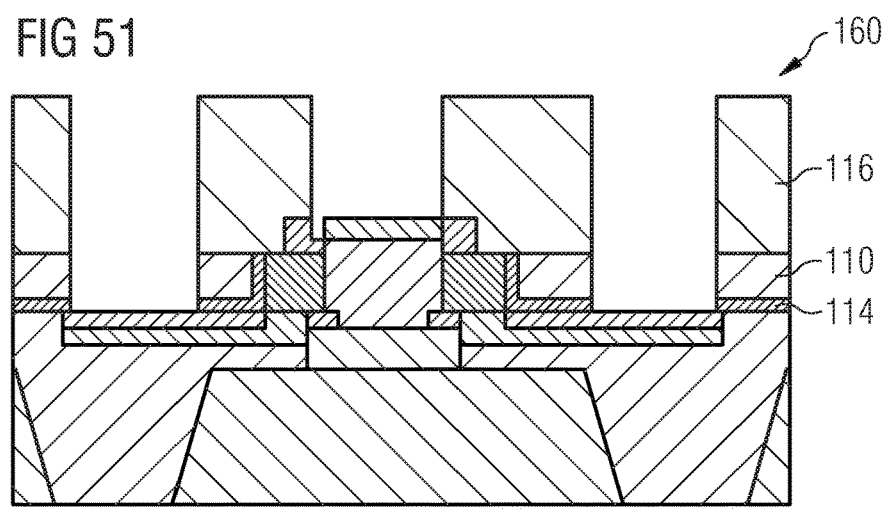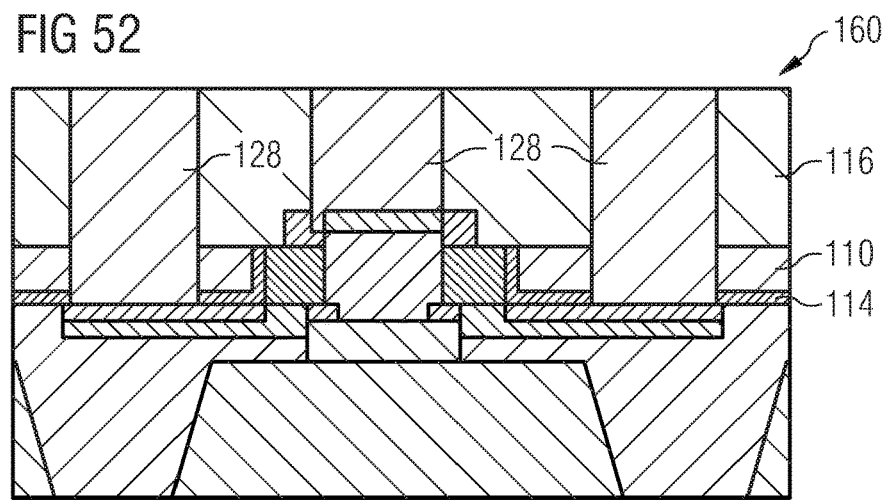

METHOD FOR MANUFACTURING ETCH STOP AREAS FOR CONTACTING SEMICONDUCTOR DEVICES

FIELD

Embodiments relate to a method for manufacturing etch stop areas for contacting semiconductor devices. One or more embodiments relate to a method for manufacturing pre-structured, self-aligned device etch stop areas for contacting semiconductor devices (e.g., heterojunction bipolar transistor (HBT) devices) below a lithography critical dimension.

BACKGROUND

A semiconductor device (e.g., a heterojunction bipolar transistor (HBT)), and, in particular, its emitter can be shrunk by using various inner spacers. Thus, the semiconductor device may become smaller than available contact critical dimensions. However, contacting such structures by the contacts larger than they themselves is nearly impossible and can cause shorts.

SUMMARY

Embodiments provide a method for manufacturing. The method includes a step of providing a semiconductor substrate having a semiconductor device, wherein the semiconductor device includes at least two semiconductor device layers to be contacted, wherein a first semiconductor device layer of the at least two semiconductor device layers is smaller than a lithographic minimum feature size used for manufacturing the semiconductor device. Further, the method includes a step of providing a first isolation layer on the semiconductor device such that the semiconductor device is covered by the isolation layer. Further, the method includes a step of planarizing the first isolation layer up to the semiconductor device. Further, the method includes a step of providing a first lithographic mask on the semiconductor device, such that the first semiconductor device layer is covered by the first lithographic mask, wherein due to the lithographic minimum feature size also a portion of the first isolation layer is covered by the first lithographic mask. Further, the method includes a step of selectively removing the first isolation layer to expose a second semiconductor device layer of the at least two semiconductor device layers while maintaining the portion of the first isolation layer that is covered by the first lithographic mask. Further, the method includes a step of providing a stop layer on the first semiconductor device layer, the second semiconductor device layer and the portion of the first isolation layer.

Further embodiments provide a method for manufacturing. The method includes a step of providing a semiconductor substrate having a semiconductor device, wherein the semiconductor device includes at least two semiconductor device layers to be contacted, wherein a first semiconductor device layer of the at least two semiconductor device layers is smaller than a lithographic minimum feature size used for manufacturing the semiconductor device, wherein the semiconductor device includes lateral spacers arranged on sidewalls of the first semiconductor device layer, wherein a second semiconductor device layer of the at least two semiconductor device layers protrudes under the first semiconductor device layer and the lateral spacers. Further, the method includes a step of providing a first stop layer on the semiconductor device such that the semiconductor device is covered by the first stop layer. Further, the method includes a step of providing a first isolation layer on the first stop layer such that the first stop layer is covered by the first isolation layer. Further, the method includes a step of planarizing the first isolation layer up to the first stop layer to expose a portion of the first stop layer that is arranged on the first semiconductor device layer and the lateral spacers, while maintaining a portion of the first isolation layer that is arranged on a portion of the second semiconductor device layer that protrudes under the first semiconductor device layer and the lateral spacers. Further, the method includes a step of providing a second stop layer on the exposed portion of the first stop layer and on the portion of the first isolation layer, such that above the first semiconductor device layer the second stop layer is arranged directly on the exposed portion of the first stop layer. Further, the method includes a step of providing a first lithographic mask on the second stop layer above the first semiconductor device layer, wherein due to the lithographic minimum feature size a lateral size of the first lithographic mask is greater than a lateral size of the first semiconductor device layer. Further, the method includes a step of selectively removing the second stop layer while maintaining a portion of the first stop layer that is covered by the first lithographic mask.

Further embodiments provide a method for manufacturing. The method includes a step of providing a semiconductor substrate having a semiconductor device, wherein the semiconductor device includes at least two semiconductor device layers to be contacted, wherein a first semiconductor device layer of the at least two semiconductor device layers is smaller than a lithographic minimum feature size used for manufacturing the semiconductor device, wherein a second semiconductor device layer of the at least two semiconductor device layers protrudes under the first semiconductor device layer. Further, the method includes a step of providing a first isolation layer on a portion of the second semiconductor device layer that protrudes under the first semiconductor device layer. Further, the method includes a step of providing a first stop layer on the first isolation layer and the first semiconductor device layer, such that the first isolation layer and the first semiconductor device layer are covered by the first stop layer. Further, the method includes a step of planarizing the first stop layer up to the first semiconductor device layer to expose the first semiconductor device layer while maintaining a portion of the first stop layer that is arranged on the first isolation layer. Further, the method includes a step of providing a first lithographic mask on the semiconductor device, such that the first semiconductor device layer is covered by the first lithographic mask, wherein due to the lithographic minimum feature size also a portion of the first stop layer is covered by the first lithographic mask. Further, the method includes a step of selectively removing the first stop layer and the first isolation layer to expose a portion of the second semiconductor device layer while maintaining the portion of the first stop layer and the first isolation layer that are covered by the first lithographic mask.

Further embodiments provide a semiconductor device. The semiconductor device includes at least two semiconductor device layers, wherein a first semiconductor device layer of the at least two semiconductor device layers is arranged on a second semiconductor device layer of the at least two semiconductor device layers that protrudes under the first semiconductor device layer. Further, the semiconductor device includes lateral isolation spacers that are arranged on sidewalls of the first semiconductor device layer. Further, the semiconductor device includes contacts contacting the first semiconductor device layer and the second semiconductor device layer. Thereby, a lateral size of the contacts is greater than a lateral size of the first semiconductor device layer.

BRIEF DESCRIPTION OF THE DRAWINGS

FIG. 1 shows a flowchart of a manufacturing method for contacting semiconductor devices according to an embodiment;

FIG. 2 shows a schematic cross-sectional view of the semiconductor device during manufacturing after the step of providing a semiconductor substrate having the semiconductor device;

FIG. 3 shows a schematic cross-sectional view of the semiconductor device during manufacturing after the step of providing a first isolation layer on the semiconductor device such that the semiconductor device is covered by the isolation layer;

FIG. 4 shows a schematic cross-sectional view of the semiconductor device during manufacturing after the step of planarizing the first isolation layer up to the semiconductor device;

FIG. 5 shows a schematic cross-sectional view of the semiconductor device during manufacturing after the step of providing a first lithographic mask on the semiconductor device, such that the first semiconductor device layer is covered by the first lithographic mask;

FIG. 13 shows a schematic cross-sectional view of the semiconductor device during manufacturing after the step of providing a semiconductor substrate having the semiconductor device;

FIG. 14 shows a schematic cross-sectional view of the semiconductor device during manufacturing after the step of providing a first stop layer on the semiconductor device such that the semiconductor device is covered by the first stop layer;

FIG. 15 shows a schematic cross-sectional view of the semiconductor device during manufacturing after the step of providing a first isolation layer on the first stop layer such that the first stop layer is covered by the first isolation layer;

FIG. 31 shows a schematic cross-sectional view of the semiconductor device during manufacturing after the step of providing a second stop layer on the exposed portion of the second semiconductor device layer, the maintained portion of the first stop layer and the first semiconductor device layer;

FIG. 32 shows a schematic cross-sectional view of the semiconductor device during manufacturing after the step of providing a second isolation layer on the second stop layer such that the second stop layer is covered by the second isolation layer;

FIG. 33 shows a schematic cross-sectional view of the semiconductor device during manufacturing after the step of providing a second lithographic mask on the second isolation layer defining contact holes for contacting the at least two semiconductor device layers, and after the step of selectively removing the second isolation layer up to the second stop layer, while maintaining portions of the second isolation layer that are covered by the second lithographic mask, to obtain the contact holes;

FIG. 42 shows a schematic cross-sectional view of a HBT during manufacturing after the step of providing a second stop layer on the first isolation layer and the emitter layer;

FIG. 43 shows a schematic cross-sectional view of a HBT during manufacturing after the step of planarizing the second stop layer up to the emitter layer, such that that the emitter layer is exposed;

FIG. 44 shows a schematic cross-sectional view of a HBT during manufacturing after the step of providing a first lithographic mask on the emitter, such that the emitter is covered by the first lithographic mask;

FIG. 45 shows a schematic cross-sectional view of a HBT during manufacturing after the step of removing the second stop layer while maintaining the emitter and a portion of the second stop layer that are covered by the first lithographic mask;

FIG. 46 shows a schematic cross-sectional view of a HBT during manufacturing after the step of removing the first lithographic mask;

FIG. 47 shows a schematic cross-sectional view of a HBT during manufacturing after the step of providing a second isolation layer on the first isolation layer, the emitter and the maintained portion of the second stop layer;

FIG. 48 shows a schematic cross-sectional view of a HBT during manufacturing after the step of providing a second lithographic mask on the second isolation layer, the second lithographic mask defining contact holes for contacting the emitter layer 168 and the base electrode;

FIG. 49 shows a schematic cross-sectional view of a HBT during manufacturing after the step of removing the second isolation layer up to the first stop layer, while maintaining a portion for the second isolation layer that is covered by the second lithographic mask;

FIG. 50 shows a schematic cross-sectional view of a HBT during manufacturing after the step of removing the first stop layer that is exposed in the contact holes up to the emitter layer and up to the base electrode;

FIG. 51 shows a schematic cross-sectional view of a HBT during manufacturing after the step of selectively removing the second lithographic mask; and FIG. 52 shows a schematic cross-sectional view of a HBT during manufacturing after the step of filling the contact holes with contact material.

DETAILED DESCRIPTION

Figure 6:
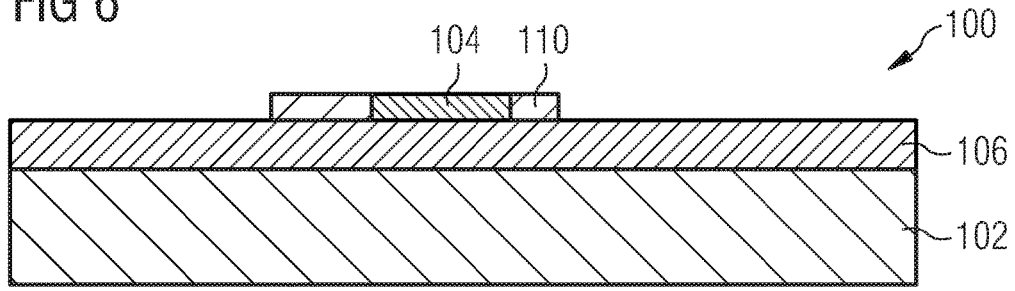
FIG. 6 shows a schematic cross-sectional view of the semiconductor device during manufacturing after the step of selectively removing the first isolation layer to expose the second semiconductor device layer, while maintaining a portion of the first isolation layer that is covered by the first lithographic mask, and after removing the lithographic mask.

Below, embodiments of the present invention will subsequently be discussed referring to the enclosed figures, wherein identical reference numerals are provided to objects or elements having the same or similar function so that the description thereof is mutually applicable and interchangeable.

FIG. 1 shows a flowchart of a method 10 for manufacturing that enables contacting a semiconductor device having at least one layer, a lateral size of which is smaller than a lithographic minimum feature size. The method 10 comprises a step 12 of providing a semiconductor substrate having a semiconductor device, wherein the semiconductor device comprises at least two semiconductor device layers to be contacted, wherein a first semiconductor device layer of the at least two semiconductor device layers is smaller than a lithographic minimum feature size used for manufacturing the semiconductor device. Further, the method 10 comprises a step 14 of providing a first isolation layer on the semiconductor device such that the semiconductor device is covered by the isolation layer. Further, the method 10 comprises a step 16 of planarizing the first isolation layer up to the semiconductor device. Further, the method 10 comprises a step 18 of providing a first lithographic mask on the semiconductor device, such that the first semiconductor device layer is covered by the first lithographic mask, wherein due to the lithographic minimum feature size also a portion of the first isolation layer is covered by the first lithographic mask. Further, the method 10 comprises a step 20 of selectively removing the first isolation layer to expose a second semiconductor device layer of the at least two semiconductor device layers while maintaining the portion of the first isolation layer that is covered by the first lithographic mask. Further, the method 10 comprises a step 22 of providing a stop layer on the first semiconductor device layer, the second semiconductor device layer and the portion of the first isolation layer.

In embodiments, the method 10 for manufacturing shown in FIG. 1 may be used for semiconductor devices having a low topography, e.g., for semiconductor devices the first semiconductor device layers of which comprise a thickness of, for example, 5 nm to 20 nm (or 5 nm to 100 nm), or for semiconductor devices a height difference (along a direction perpendicular to a surface of the semiconductor substrate) between the first semiconductor device layer and the second semiconductor device layer of which is between, for example, 5 nm and 20 nm (or 5 nm and 100 nm).

Subsequently, embodiments of the manufacturing method 10 shown in FIG. 1 are described in further detail making reference to FIGS. 2 to 11 which show cross-sectional views of the semiconductor device after different manufacturing steps.

FIG. 2 shows a schematic cross-sectional view of the semiconductor device 100 during manufacturing after the step 12 of providing a semiconductor substrate 102 having the semiconductor device 100. The semiconductor device 100 can comprise at least two semiconductor device layers 104 and 106 to be contacted, wherein a first semiconductor device layer 104 of the at least two semiconductor device layers 104 and 106 is smaller than a lithographic minimum feature size used for manufacturing the semiconductor device 100.

Thus, a lateral size 105 (i.e., a size (or dimension or extent) parallel to a surface 108 of the semiconductor substrate 102) of the first semiconductor device layer 104 is smaller than the lithographic minimum feature size used for manufacturing the semiconductor device 100.

As shown in FIG. 2, the first semiconductor device layer 104 can be arranged on a second semiconductor device layer 106 of the at least two semiconductor device layers 104 and 106. The second semiconductor device layer 106 can protrude under the first semiconductor device layer 104.

The first semiconductor device layer 104 can be of a first semiconductive type, wherein the second semiconductor device layer 106 can be of a second semiconductive type. For example, the first semiconductor device layer 104 can be a n-type semiconductor, wherein the second semiconductor device layer 106 can be a p-type semiconductor. Naturally, also the first semiconductor device layer 104 can be a p-type semiconductor, wherein the second semiconductor device layer 106 can be a n-type semiconductor The semiconductor device 100 can be a generic device, such as a pn-junction or a transistor, e.g., a bipolar transistor or a heterojunction bipolar transistor.

FIG. 3 shows a schematic cross-sectional view of the semiconductor device 100 during manufacturing after the step 14 of providing a first isolation layer (or landing pad) 110 on the semiconductor device 100 such that the semiconductor device 100 is covered by the isolation layer 110.

In detail, the first isolation layer 110 can be provided on the semiconductor device 100 such that the first semiconductor device layer 104 and the second semiconductor device layer 106 are covered by the first isolation layer 110.

For example, the first isolation layer 110 can be a dielectric layer, such as an oxide layer. The dielectric layer 110 can be deposited on the semiconductor device 100 such that the semiconductor device 100 is covered by the oxide layer 110.

FIG. 4 shows a schematic cross-sectional view of the semiconductor device 100 during manufacturing after the step 16 of planarizing the first isolation layer 110 up to the semiconductor device 100.

In detail, the first isolation layer 110 can be planarized up to the first semiconductor device layer 104 such that the first semiconductor device layer 104 is exposed, while maintaining a portion of the first isolation layer 110 that is arranged on the second semiconductor device layer 106 (e.g., the portion of the first isolation layer 110 around the first semiconductor device layer 104).

FIG. 5 shows a schematic cross-sectional view of the semiconductor device 100 during manufacturing after the step 18 of providing a first lithographic mask 112 on the semiconductor device 100, such that the first semiconductor device layer 104 is covered by the first lithographic mask 112.

As shown in FIG. 5, due to the lithographic minimum feature size (due to which the lateral size 105 of the first semiconductor device layer 104 is smaller than a lateral size 113 of the first lithographic mask 112) also a portion of the first isolation layer 110 (i.e., the portion of the first isolation layer 110 arranged directly on the second semiconductor device layer 106/the portion of the first isolation layer 110 arranged around the first semiconductor device layer 104) is covered by the first lithographic mask 112.

In other words, FIG. 5 shows a schematic cross-sectional view of the semiconductor device 100 during manufacturing after a landing pad lithography step.

FIG. 6 shows a schematic cross-sectional view of the semiconductor device 100 during manufacturing after the step 20 of selectively removing the first isolation layer 110 to expose the second semiconductor device layer 106, while maintaining a portion of the first isolation layer 110 that is covered by the first lithographic mask 112, and after removing the lithographic mask 112.

In other words, FIG. 6 shows a schematic cross-sectional view of the semiconductor device 100 during manufacturing after a landing pad 110 etch step.

Figure 7:
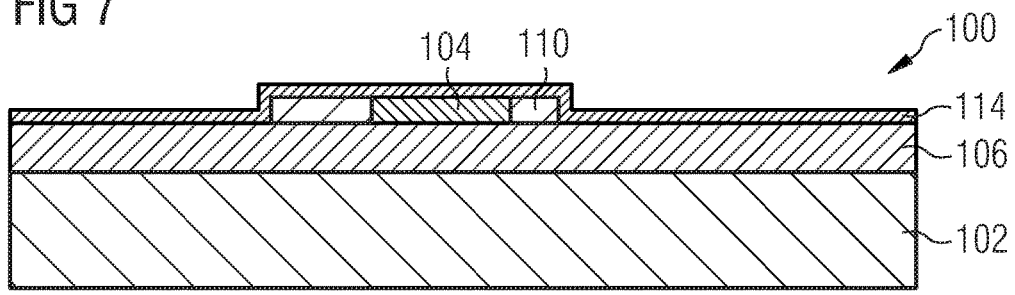
FIG. 7 shows a schematic cross-sectional view of the semiconductor device during manufacturing after the step of providing a stop layer on the first semiconductor device layer, the second semiconductor device layer and the portion of the first isolation layer.

FIG. 7 shows a schematic cross-sectional view of the semiconductor device 100 during manufacturing after the step 22 of providing a stop layer (e.g., etch stop layer) 114 on the first semiconductor device layer 104, the second semiconductor device layer 106 and the portion of the first isolation layer 110 (that was previously covered by the first lithographic mask 112).

For example, the stop layer 114 can be a nitride layer. The nitride layer 114 can be deposited on the first semiconductor device layer 104, the second semiconductor device layer 106 and the portion of the first isolation layer 110.

Figure 8:
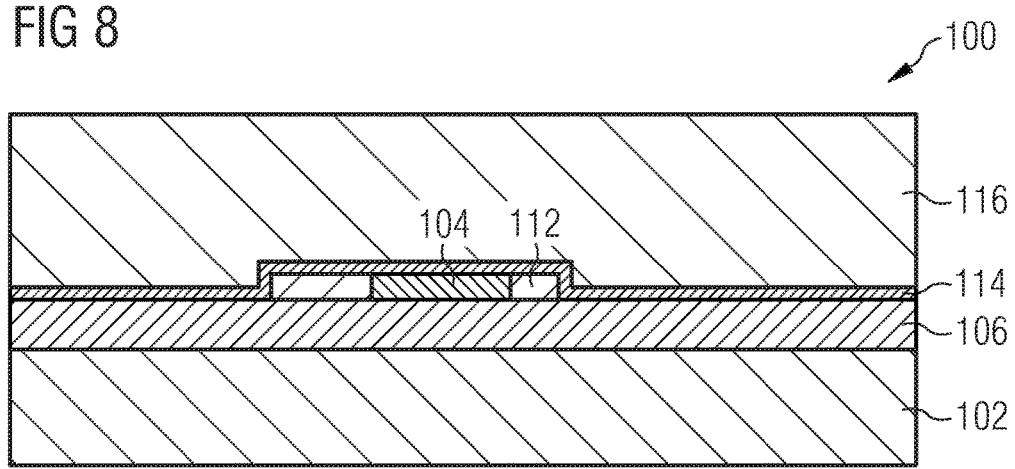
FIG. 8 shows a schematic cross-sectional view of the semiconductor device during manufacturing after the step of providing a second isolation layer on the stop layer, such that the stop layer is covered by the second isolation layer.

FIG. 8 shows a schematic cross-sectional view of the semiconductor device 100 during manufacturing after the step of providing a second isolation layer 116 on the stop layer 114, such that the stop layer is covered by the second isolation layer 116.

For example, the second isolation layer 116 can be an ILD (ILD=inter-layer dielectric) layer 116, e.g., a contact ILD layer. The ILD layer 116 can be deposited on the on the stop layer 114, such that the stop layer 114 is covered by the ILD layer 116.

Further, the second isolation layer 116 can be planarized.

Figure 9:
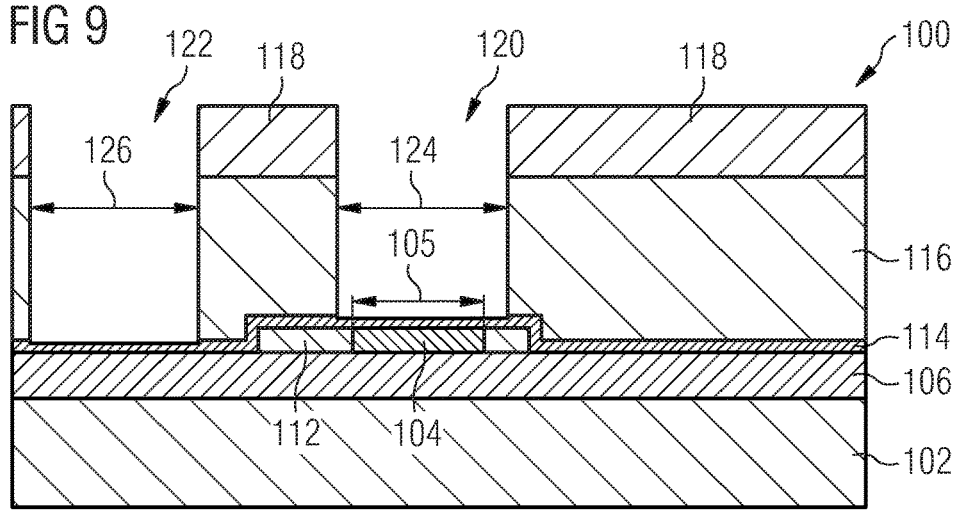
FIG. 9 shows a schematic cross-sectional view of the semiconductor device during manufacturing after the step of providing a second lithographic mask on the second isolation layer defining contact holes for contacting the at least two semiconductor device layers, and after the step of selectively removing the second isolation layer up to the stop layer while maintaining portions of the second isolation layer covered by the second lithographic mask, to obtain the contact holes.

FIG. 9 shows a schematic cross-sectional view of the semiconductor device 100 during manufacturing after the step of providing a second lithographic mask 118 on the second isolation layer 116 defining contact holes 120 and 122 (through the second isolation layer 116 and the stop layer 114) for contacting the at least two semiconductor device layers 104 and 106, and after the step of selectively removing the second isolation layer 116 up to the stop layer 114 while maintaining portions of the second isolation layer 116 covered by the second lithographic mask 118, to obtain the contact holes 120 and 122.

As shown in FIG. 9, the second lithographic mask 118 may define a first contact hole 120 through the second isolation layer 116 and the stop layer 114 for contacting the first semiconductor device layer 104, and a second contact hole 122 through the second isolation layer 116 and the stop layer 114 for contacting the second semiconductor device layer 106.

For example, the second isolation layer 116 can be removed by an etch process with stop on the stop layer (e.g., etch stop layer) 114.

Further, as shown in FIG. 9, due to the lithographic minimum feature size a lateral size 124 and 126 of the contact holes 120 and 126 is greater than a lateral size 105 of the first semiconductor device layer 104.

In other words, FIG. 9 shows a schematic cross-sectional view of the semiconductor device 100 during manufacturing after a contact lithography step and an ILD etch step.

Figure 10:
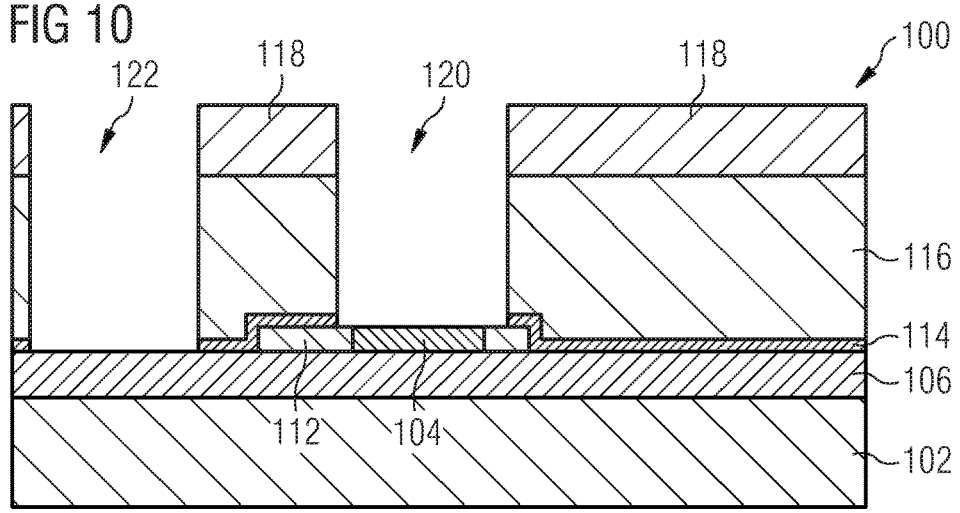
FIG. 10 shows a schematic cross-sectional view of the semiconductor device during manufacturing after the step of selectively removing the stop layer that is exposed in the contact holes up to the first semiconductor device layer and up to the second semiconductor device layer.

FIG. 10 shows a schematic cross-sectional view of the semiconductor device 100 during manufacturing after the step of selectively removing the stop layer 114 that is exposed in the contact holes 120 and 122 up to the first semiconductor device layer 104 and up to the second semiconductor device layer 106.

In detail, the stop layer 114 that is exposed in the first contact hole 120 can be removed up to the first semiconductor device layer 104 such that the first semiconductor device layer 104 is exposed in the first contact hole 120.

Further, the stop layer 114 that is exposed in the second contact hole 122 can be removed up to the second semiconductor device layer 106 such that the second semiconductor device layer 106 is exposed in the second contact hole 122.

For example, the stop layer 114 (e.g., a nitride layer) can be removed by an etch process.

Figure 11:
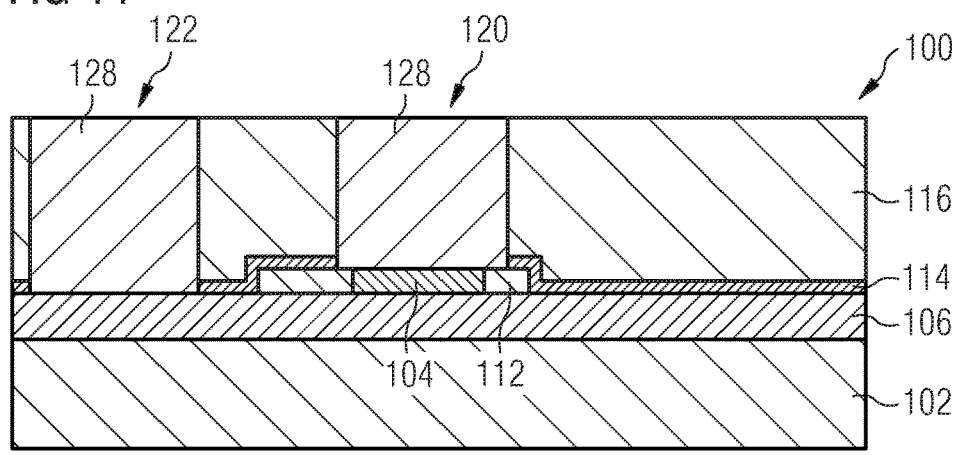
FIG. 11 shows a schematic cross-sectional view of the semiconductor device during manufacturing after the step of filling the contact holes with contact material thereby contacting the first semiconductor device layer and the second semiconductor device layer.

FIG. 11 shows a schematic cross-sectional view of the semiconductor device 100 during manufacturing after the step of filling the contact holes 120 and 122 with contact material 128 thereby contacting the first semiconductor device layer 104 and the second semiconductor device layer 106.

The contact material 128 can be, for example, tungsten. Naturally, also any other material suitable for contacting a semiconductor material may be used.

Figure 12:
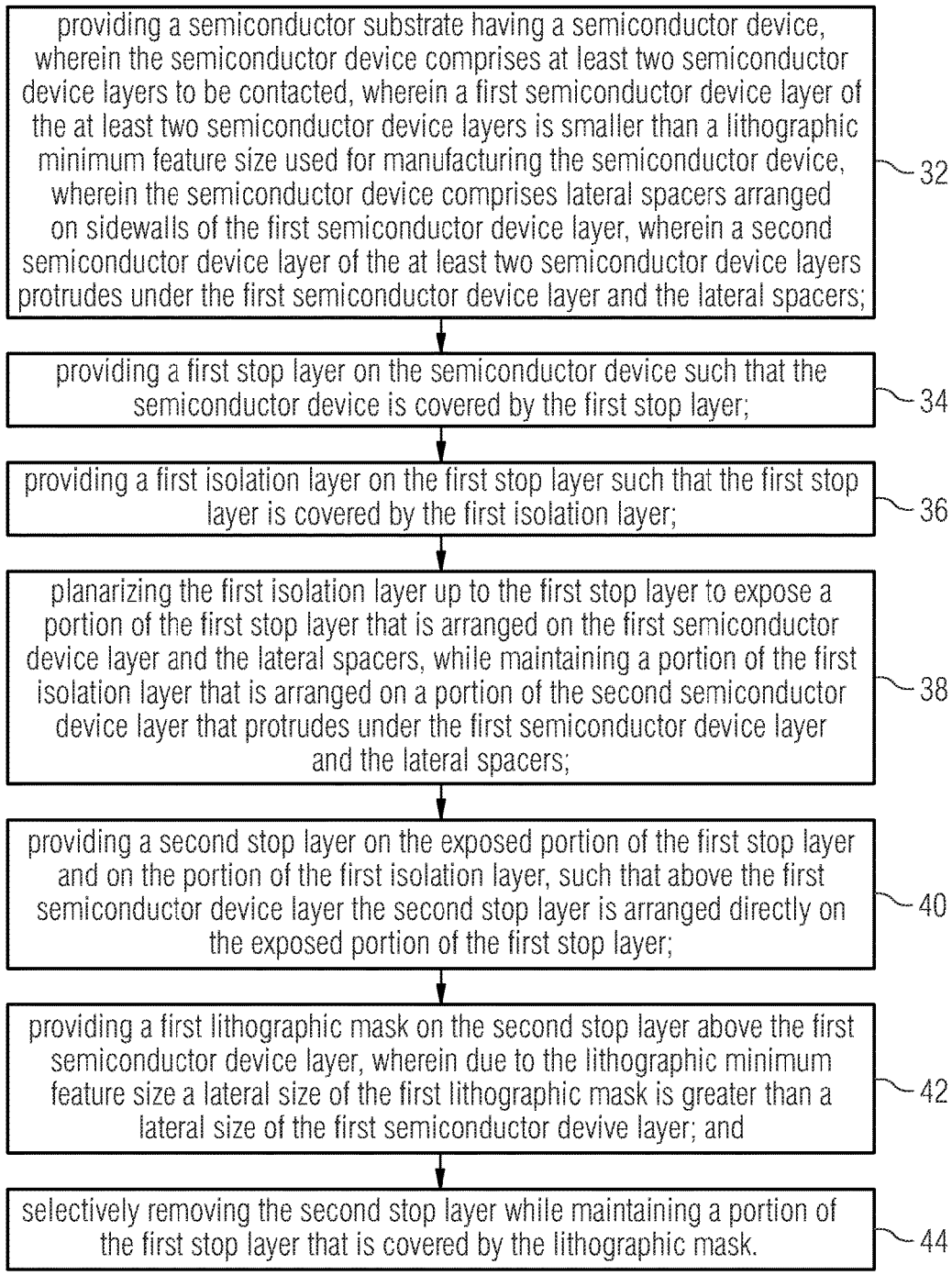
FIG. 12 shows a flowchart of a method for manufacturing that enables contacting a semiconductor device having at least one layer, a lateral size of which is smaller than a lithographic minimum feature size.

FIG. 12 shows a flowchart of a method 30 for manufacturing that enables contacting a semiconductor device having at least one layer, a lateral size of which is smaller than a lithographic minimum feature size. The method 30 comprises a step 32 of providing a semiconductor substrate having a semiconductor device, wherein the semiconductor device comprises at least two semiconductor device layers to be contacted, wherein a first semiconductor device layer of the at least two semiconductor device layers is smaller than a lithographic minimum feature size used for manufacturing the semiconductor device, wherein the semiconductor device comprises lateral spacers arranged on sidewalls of the first semiconductor device layer, wherein a second semiconductor device layer of the at least two semiconductor device layers protrudes under the first semiconductor device layer and the lateral spacers. Further, the method 30 comprises a step 34 of providing a first stop layer on the semiconductor device such that the semiconductor device is covered by the first stop layer. Further, the method 30 comprises a step 36 of providing a first isolation layer on the first stop layer such that the first stop layer is covered by the first isolation layer. Further, the method 30 comprises a step 38 of planarizing the first isolation layer up to the first stop layer to expose a portion of the first stop layer that is arranged on the first semiconductor device layer and the lateral spacers, while maintaining a portion of the first isolation layer that is arranged on a portion of the second semiconductor device layer that protrudes under the first semiconductor device layer and the lateral spacers. Further, the method 30 comprises a step 40 of providing a second stop layer on the exposed portion of the first stop layer and on the portion of the first isolation layer, such that above the first semiconductor device layer the second stop layer is arranged directly on the exposed portion of the first stop layer. Further, the method 30 comprises a step 42 of providing a first lithographic mask on the second stop layer above the first semiconductor device layer, wherein due to the lithographic minimum feature size a lateral size of the first lithographic mask is greater than a lateral size of the first semiconductor device layer. Further, the method 30 comprises a step 44 of selectively removing the second stop layer while maintaining a portion of the first stop layer that is covered by the first lithographic mask.

In embodiments, the method 10 for manufacturing shown in FIG. 12 may be used for semiconductor devices having a high topography, e.g., for semiconductor devices the first semiconductor device layers of which comprise a thickness of, for example, 50 nm (or 100 nm) or more, or for semiconductor devices a height difference (along a direction perpendicular to a surface of the semiconductor substrate)

between the first semiconductor device layer and the second semiconductor device layer of which is, for example, 50 nm (or 100 nm) or more.

Subsequently, embodiments of the manufacturing method 10 shown in FIG. 12 are described in further detail making reference to FIGS. 13 to 23 which show cross-sectional views of the semiconductor device after different manufacturing steps.

FIG. 13 shows a schematic cross-sectional view of the semiconductor device 100 during manufacturing after the step 32 of providing a semiconductor substrate 102 having the semiconductor device 100. The semiconductor device 100 can comprise at least two semiconductor device layers 104 and 106 to be contacted, wherein a first semiconductor device layer 104 of the at least two semiconductor device layers 104 and 106 is smaller than a lithographic minimum feature size used for manufacturing the semiconductor device 100.

Thus, a lateral size 105 (i.e., a size (or dimension or extent) parallel to a surface 108 of the semiconductor substrate 102) of the first semiconductor device layer 104 is smaller than the lithographic minimum feature size used for manufacturing the semiconductor device 100.

As shown in FIG. 13, the first semiconductor device layer 104 can be arranged on a second semiconductor device layer 106 of the at least two semiconductor device layers 104 and 106. The second semiconductor device layer 106 can protrude under the first semiconductor device layer 104. Further, the semiconductor device 100 comprises lateral spacers 103 arranged on sidewalls of the first semiconductor device layer 104.

The first semiconductor device layer 104 can be of a first semiconductive type, wherein the second semiconductor device layer 106 can be of a second semiconductive type. For example, the first semiconductor device layer 104 can be a n-type semiconductor, wherein the second semiconductor device layer 106 can be a p-type semiconductor. Naturally, also the first semiconductor device layer 104 can be a p-type semiconductor, wherein the second semiconductor device layer 106 can be a n-type semiconductor.

The semiconductor device 100 can be a generic device with a spacer, such as a pn-junction or a transistor, e.g., a bipolar transistor or a heterojunction bipolar transistor.

FIG. 14 shows a schematic cross-sectional view of the semiconductor device 100 during manufacturing after the step 34 of providing a first stop layer (e.g., etch stop layer) 114 on the semiconductor device such that the semiconductor device 100 is covered by the first stop layer 114.

In detail, the first stop layer 114 can be provided on the semiconductor device 100 such that the first stop layer 114 covers the first semiconductor device layer 104, the lateral spacers 103 and a portion of the second semiconductor device layer 106 that is not covered by the first semiconductor device layer 104 and the lateral spacers 103.

For example, the first stop layer 114 can be a nitride layer. The nitride layer 114 can be deposited on the semiconductor device such that the semiconductor device 100 is covered by the first stop layer 114.

FIG. 15 shows a schematic cross-sectional view of the semiconductor device 100 during manufacturing after the step 36 of providing a first isolation layer 110 on the first stop layer 114 such that the first stop layer 114 is covered by the first isolation layer 110.

For example, the first isolation layer 110 can be an ILD (ILD=inter-layer dielectric) layer 110, e.g., a contact ILD layer. The ILD layer 110 can be deposited on the on the first stop layer 114, such that the first stop layer 114 is covered by the ILD layer 110.

Figure 16:
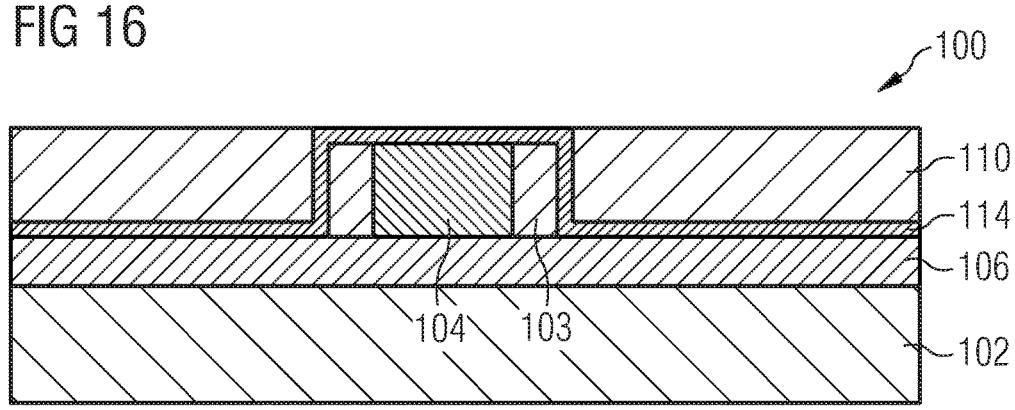
FIG. 16 shows a schematic cross-sectional view of the semiconductor device during manufacturing after the step of planarizing the first isolation layer up to the first stop layer to expose a portion of the first stop layer that is arranged on the first semiconductor device layer and the lateral spacers, while maintaining a portion of the first isolation layer that is arranged on a portion of the second semiconductor device layer that protrudes under the first semiconductor device layer and the lateral spacers.

FIG. 16 shows a schematic cross-sectional view of the semiconductor device 100 during manufacturing after the step 38 of planarizing the first isolation layer 110 up to the first stop layer 114 to expose a portion of the first stop layer 114 that is arranged on the first semiconductor device layer 104 and the lateral spacers 103, while maintaining a portion of the first isolation layer 110 that is arranged on a portion of the second semiconductor device layer 106 that protrudes under the first semiconductor device layer 104 and the lateral spacers 103.

In other words, FIG. 16 shows a schematic cross-sectional view of the semiconductor device 100 during manufacturing after an ILD planarizing step.

Figure 17:
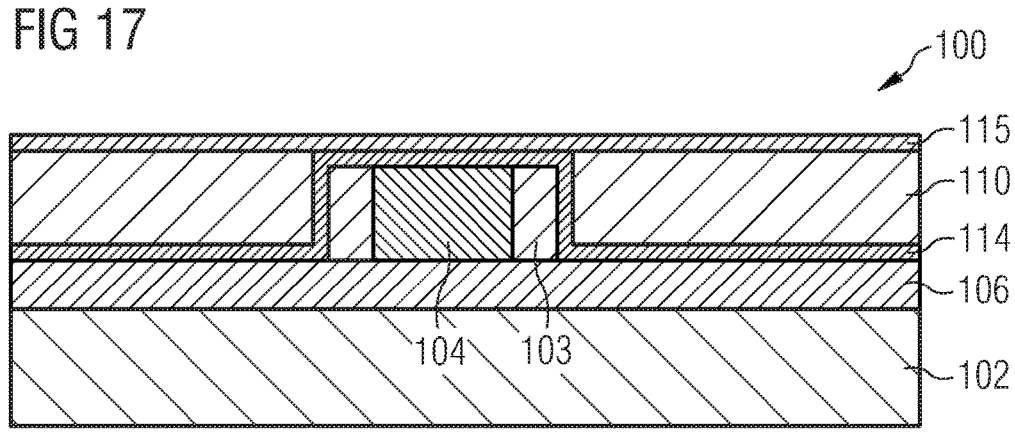
FIG. 17 shows a schematic cross-sectional view of the semiconductor device during manufacturing after the step of providing a second stop layer on the exposed portion of the first stop layer and on the portion of the first isolation layer, such that above the first semiconductor device layer the second stop layer is arranged directly on the exposed portion of the first stop layer.

FIG. 17 shows a schematic cross-sectional view of the semiconductor device 100 during manufacturing after the step 40 of providing a second stop layer (e.g., etch stop layer) 115 on the exposed portion of the first stop layer 114 and on the portion of the first isolation layer 110, such that above the first semiconductor device layer 104 the second stop layer 115 is arranged directly on the exposed portion of the first stop layer 114.

As shown in FIG. 17, partially providing the second stop layer 115 directly on the first stop layer 114 results in a thicker stop layer (=first stop layer 114+second stop layer 115) on the first semiconductor device layer 104 (and the lateral spacers 103) compared to the stop layer (=first stop layer 114) on the second semiconductor device layer 106.

For example, the second stop layer 115 can be a nitride layer. The nitride layer 115 can be deposited on the on the exposed portion of the first stop layer 114 and on the portion of the first isolation layer 110, such that above the first semiconductor device layer 104 the nitride layer 115 is arranged directly on the exposed portion of the nitride layer 114.

Figure 18:
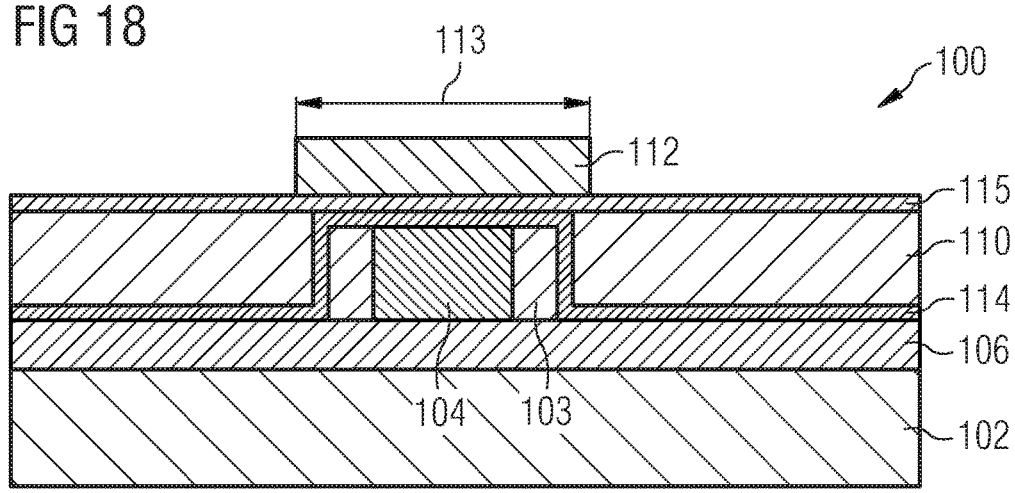
FIG. 18 shows a schematic cross-sectional view of the semiconductor device during manufacturing after the step of providing a first lithographic mask on the second stop layer above the first semiconductor device layer, wherein due to the lithographic minimum feature size a lateral size of the first lithographic mask is greater than a lateral size of the first semiconductor device layer.

FIG. 18 shows a schematic cross-sectional view of the semiconductor device 100 during manufacturing after the step 42 of providing a first lithographic mask 112 on the second stop layer 115 above (or adjacent to) the first semiconductor device layer 104, wherein due to the lithographic minimum feature size a lateral size 113 of the first lithographic mask 112 is greater than a lateral size 105 of the first semiconductor device layer 104.

As shown in FIG. 18, due to the lithographic minimum feature size, the lateral size 105 of the first semiconductor device layer 104 is smaller than a lateral size 113 of the first lithographic mask 112. Thus, the first lithographic mask 112 also covers a portion of the second stop layer 115 that is arranged on the first isolation layer 110.

In other words, FIG. 18 shows a schematic cross-sectional view of the semiconductor device 100 during manufacturing after a landing pad 110 lithography step.

Figure 19:
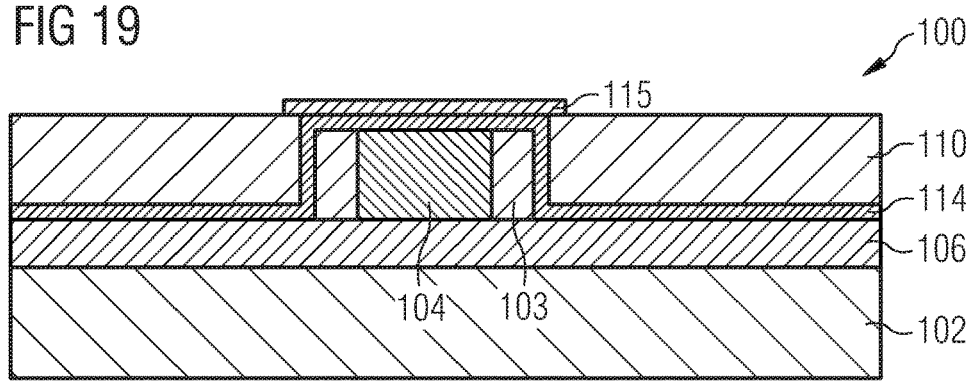
FIG. 19 shows a schematic cross-sectional view of the semiconductor device during manufacturing after the step of selectively removing the second stop layer while maintaining a portion of the second stop layer that is covered by the first lithographic mask, and after removing the first lithographic mask.

FIG. 19 shows a schematic cross-sectional view of the semiconductor device 100 during manufacturing after the step 44 of selectively removing the second stop layer 115 while maintaining a portion of the second stop layer 115 that is covered by the first lithographic mask 112, and after removing the first lithographic mask 112.

In other words, FIG. 19 shows a schematic cross-sectional view of the semiconductor device 100 during manufacturing after a landing pad etch step.

Figure 20:
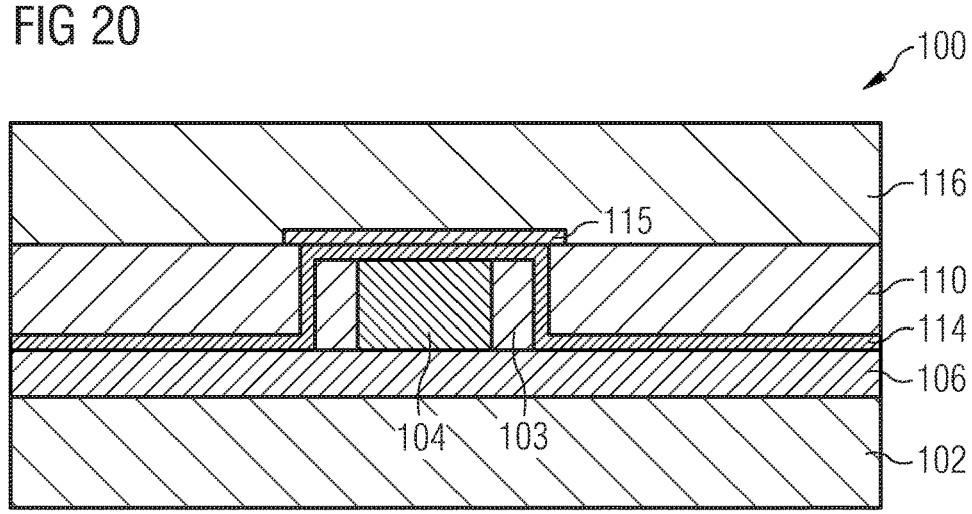
FIG. 20 shows a schematic cross-sectional view of the semiconductor device during manufacturing after the step of providing a second isolation layer on the portion of the second stop layer above the first semiconductor device layer that was covered by the first lithographic mask and on the portion of the first isolation layer.

FIG. 20 shows a schematic cross-sectional view of the semiconductor device 100 during manufacturing after the step of providing a second isolation layer 116 on the portion of the second stop layer 115 above the first semiconductor device layer that was covered by the first lithographic mask and on the portion of the first isolation layer 110.

For example, the second isolation layer 116 can be an ILD (ILD=inter-layer dielectric) layer 116, e.g., a contact ILD layer. The ILD layer 116 can be deposited on the portion of the second stop layer 115 above the first semiconductor device layer that was covered by the first lithographic mask and on the portion of the first isolation layer 110, such that the portion of the second stop layer 115 above the first semiconductor device layer that was covered by the first lithographic mask and the portion of the first isolation layer 110 are covered by the ILD layer 116.

Further, the second isolation layer 116 can be planarized.

Figure 21:
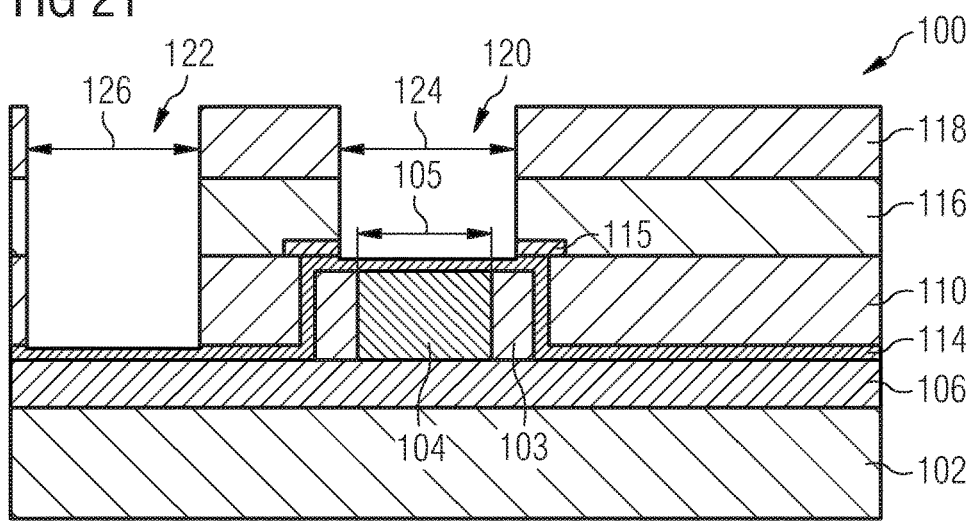
FIG. 21 shows a schematic cross-sectional view of the semiconductor device during manufacturing after the step of providing a second lithographic mask on the second isolation layer defining contact holes for contacting the at least two semiconductor device layers, and after the step of selectively removing the isolation layer up to the stop layer while maintaining portions of the isolation layer covered by the second lithographic mask, to obtain the contact holes.

FIG. 21 shows a schematic cross-sectional view of the semiconductor device 100 during manufacturing after the step of providing a second lithographic mask 118 on the second isolation layer 116 defining contact holes 120 and 122 (through the isolation layer(s) 116 (and 110) and the stop layer(s) 114 (and 115)) for contacting the at least two semiconductor device layers 104 and 106, and after the step of selectively removing the isolation layer(s) 116 (and 110) up to the stop layer 114 while maintaining portions of the isolation layer(s) 116 (and 110) covered by the second lithographic mask 118, to obtain the contact holes 120 and 122.

In detail, as shown in FIG. 21, the second lithographic mask 118 may define a first contact hole 120 through the second isolation layer 116, the second stop layer 115 and the first stop layer 114 for contacting the first semiconductor device layer 104, and a second contact hole 126 through the second isolation layer 116, the first isolation layer 110 and the first stop layer 114 for contacting the second semiconductor device layer 106.

For example, the isolation layer(s) 116 (and 110) can be removed by an etch process with stop on the stop layer(s) (e.g., etch stop layer(s)) 114 (and 115). Since the stop layer (=first stop layer 114+second stop layer 115) on the first semiconductor device layer 104 (and the lateral spacers 103) is thicker compared to the stop layer (=first stop layer 114) on the second semiconductor device layer 106, the first semiconductor device layer 104 is protected, while removing (e.g., etching) the second isolation layer 116 in the second contact hole 122 above the second semiconductor device layer 106. Without the thicker stop layer (=first stop layer 114+second stop layer 115) on the first semiconductor device layer 104, the first semiconductor device layer 104 would be affected (e.g., etched) while removing e.g., etching) the second isolation layer 116 in the second contact hole 122 above the second semiconductor device layer 106, due to the great height difference (along a direction perpendicular to a surface of the semiconductor substrate) between the first semiconductor device layer 104 and the second semiconductor device layer 106.

Further, as shown in FIG. 21, due to the lithographic minimum feature size a lateral size 124 and 126 of the contact holes 120 and 126 is greater than a lateral size 105 of the first semiconductor device layer 104.

In other words, FIG. 21 shows a schematic cross-sectional view of the semiconductor device 100 during manufacturing after a contact lithography step and an ILD etch step.

Figure 22:
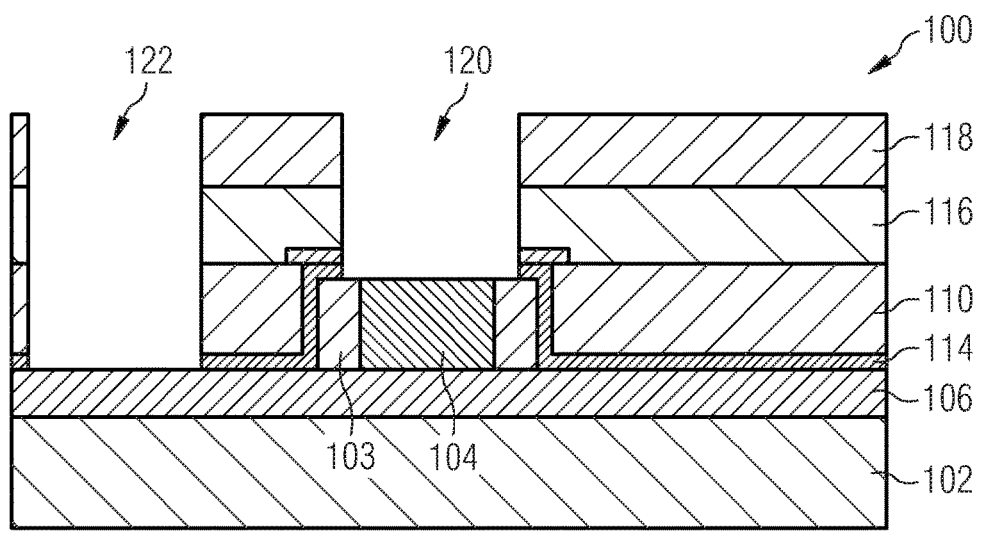
FIG. 22 shows a schematic cross-sectional view of the semiconductor device during manufacturing after the step of selectively removing the stop layers that are exposed in the contact holes up to the first semiconductor device layer and up to the second semiconductor device layer.

FIG. 22 shows a schematic cross-sectional view of the semiconductor device 100 during manufacturing after the step of selectively removing the stop layers that are exposed in the contact holes 120 and 122 up to the first semiconductor device layer 104 and up to the second semiconductor device layer 106.

In detail, the stop layer 114 that is exposed in the first contact hole 120 can be removed up to the first semiconductor device layer 104 such that the first semiconductor device layer 104 is exposed in the first contact hole 120. Further, the stop layer 114 that is exposed in the second contact hole 122 can be removed up to the second semiconductor device layer 106 such that the second semiconductor device layer 106 is exposed in the second contact hole 122.

For example, the stop layer 114 (e.g., a nitride layer) can be removed by an etch process.

Note that in FIG. 22 it is assumed that the second stop layer 115 above the first semiconductor device layer 104 is completely removed, while removing (e.g., etching) the second isolation layer 116 in the second contact hole 122 above the second semiconductor device layer 106. In dependence on the thickness of the second stop layer and also in dependence on the height difference (along a direction perpendicular to a surface of the semiconductor substrate) between the first semiconductor device layer 104 and the second semiconductor device layer 106, it is also possible that thin portion of the second stop layer 115 remains on the first stop layer 114 which can be removed together with the first stop layer 114.

Figure 23:
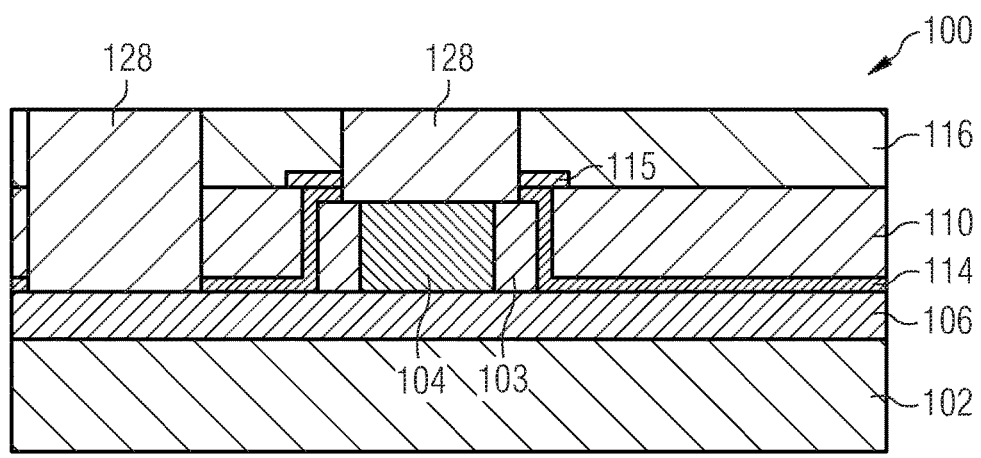
FIG. 23 shows a schematic cross-sectional view of the semiconductor device during manufacturing after the step of filling the contact holes with contact material thereby contacting the first semiconductor device layer and the second semiconductor device layer.

FIG. 23 shows a schematic cross-sectional view of the semiconductor device 100 during manufacturing after the step of filling the contact holes 120 and 122 with contact material 128 thereby contacting the first semiconductor device layer 104 and the second semiconductor device layer 106.

The contact material 128 can be, for example, tungsten. Naturally, also any other material suitable for contacting a semiconductor material may be used.

Figure 24:
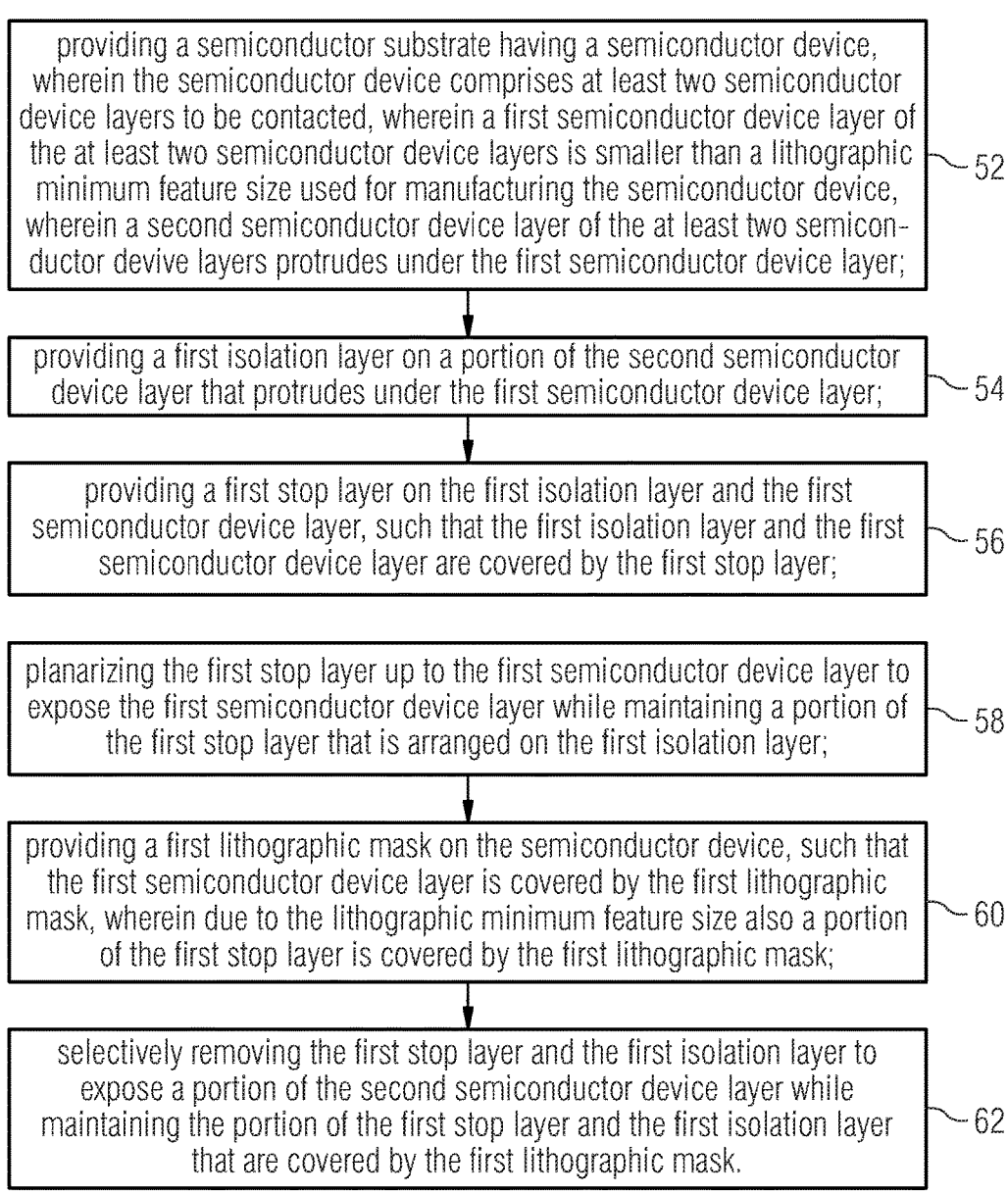
FIG. 24 shows a flowchart of a method for manufacturing that enables contacting a semiconductor device having at least one layer, a lateral size of which is smaller than a lithographic minimum feature size.

FIG. 24 shows a flowchart of a method 50 for manufacturing that enables contacting a semiconductor device having at least one layer, a lateral size of which is smaller than a lithographic minimum feature size. The method 50 comprises a step 52 of providing a semiconductor substrate having a semiconductor device, wherein the semiconductor device comprises at least two semiconductor device layers to be contacted, wherein a first semiconductor device layer of the at least two semiconductor device layers is smaller than a lithographic minimum feature size used for manufacturing the semiconductor device, wherein a second semiconductor device layer of the at least two semiconductor device layers protrudes under the first semiconductor device layer. Further, the method 50 comprises a step 54 of providing a first isolation layer on a portion of the second semiconductor device layer that protrudes under the first semiconductor device layer. Further, the method 50 comprises a step 56 of providing a first stop layer on the first isolation layer and the first semiconductor device layer, such that the first isolation layer and the first semiconductor device layer are covered by the first stop layer. Further, the method 50 comprises a step 58 of planarizing the first stop layer up to the first semiconductor device layer to expose the first semiconductor device layer while maintaining a portion of the first stop layer that is arranged on the first isolation layer. Further, the method 50 comprises a step 60 of providing a first lithographic mask on the semiconductor device, such that the first semiconductor device layer is covered by the first lithographic mask, wherein due to the lithographic minimum feature size also a portion of the first stop layer is covered by the first lithographic mask. Further, the method 50 comprises a step 62 of selectively removing the first stop layer and the first isolation layer to expose a portion of the second semiconductor device layer while maintaining the portion of the first stop layer and the first isolation layer that are covered by the first lithographic mask.

In embodiments, the method 50 for manufacturing shown in FIG. 24 may be used for semiconductor devices having a high topography, e.g., for semiconductor devices the first semiconductor device layers of which comprise a thickness of, for example, 50 nm (or 100 nm) or more, or for semiconductor devices a height difference (along a direction perpendicular to a surface of the semiconductor substrate) between the first semiconductor device layer and the second semiconductor device layer of which is for example, 50 nm (or 100 nm) or more.

Subsequently, embodiments of the manufacturing method 10 shown in FIG. 24 are described in further detail making reference to FIGS. 25 to 35 which show cross-sectional views of the semiconductor device after different manufacturing steps.

Figure 25:
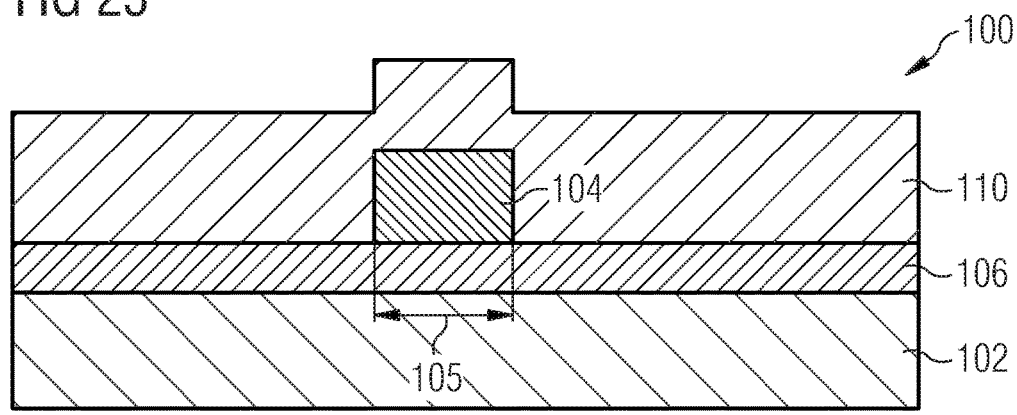
FIG. 25 shows a schematic cross-sectional view of the semiconductor device during manufacturing after the step of providing a semiconductor substrate having the semiconductor device, and after the step of providing a first isolation layer on the first semiconductor device layer and on a portion of the second semiconductor device layer that protrudes under the first semiconductor device layer.

FIG. 25 shows a schematic cross-sectional view of the semiconductor device 100 during manufacturing after the step 32 of providing a semiconductor substrate 102 having the semiconductor device 100, and after the step 54 of providing a first isolation layer 110 on the first semiconductor device layer 104 and on a portion of the second semiconductor device layer 106 that protrudes under the first semiconductor device layer 104.

The semiconductor device 100 can comprise at least two semiconductor device layers 104 and 106 to be contacted, wherein a first semiconductor device layer 104 of the at least two semiconductor device layers 104 and 106 is smaller than a lithographic minimum feature size used for manufacturing the semiconductor device 100.

Thus, a lateral size 105 (i.e., a size (or dimension or extent) parallel to a surface 108 of the semiconductor substrate 102) of the first semiconductor device layer 104 is smaller than the lithographic minimum feature size used for manufacturing the semiconductor device 100.

As shown in FIG. 25, the first semiconductor device layer 104 can be arranged on a second semiconductor device layer 106 of the at least two semiconductor device layers 104 and 106. The second semiconductor device layer 106 can protrude under the first semiconductor device layer 104. Further, the semiconductor device 100 comprises lateral spacers 103 arranged on sidewalls of the first semiconductor device layer 104.

The first semiconductor device layer 104 may have a thickness of x to x nm.

The second semiconductor device layer 106 may have a thickness of x to x nm.

The first semiconductor device layer 104 can be of a first semiconductive type, wherein the second semiconductor device layer 106 can be of a second semiconductive type. For example, the first semiconductor device layer 104 can be a n-type semiconductor, wherein the second semiconductor device layer 106 can be a p-type semiconductor. Naturally, also the first semiconductor device layer 104 can be a p-type semiconductor, wherein the second semiconductor device layer 106 can be a n-type semiconductor.

The semiconductor device 100 can be a generic device with a spacer, such as a pn-junction or a transistor, e.g., a bipolar transistor or a heterojunction bipolar transistor.

The first isolation layer 110 can be, for example, an ILD (ILD=inter-layer dielectric) layer 110, e.g., a contact ILD layer. The ILD layer 110 can be deposited on the on the first stop layer 114, such that the first stop layer 114 is covered by the ILD layer 110.

Figure 26:
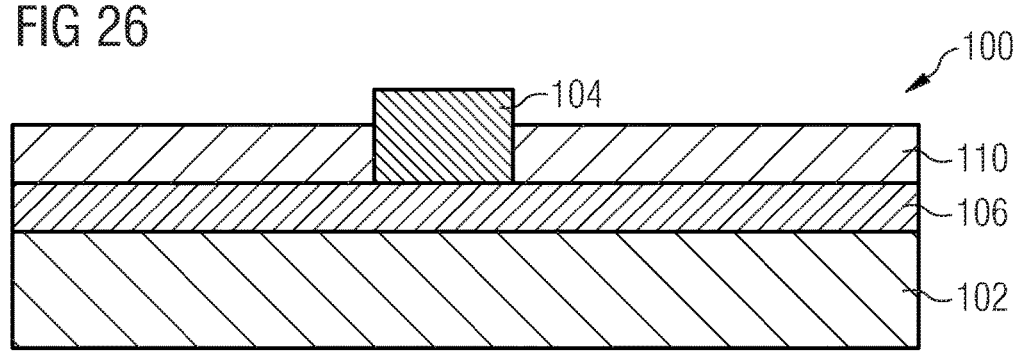
FIG. 26 shows a schematic cross-sectional view of the semiconductor device during manufacturing after the step of planarizing the first isolation layer up to the first semiconductor device layer, and after the step of partially recessing the first isolation layer.

FIG. 26 shows a schematic cross-sectional view of the semiconductor device 100 during manufacturing after the step or planarizing the first isolation layer 110 up to the first semiconductor device layer 104, and after the step of partially recessing the first isolation layer 110.

As shown in FIG. 26, the step of partially recessing the first isolation layer 110 leads to a thinning of the first isolation layer 110 covering the portion of the second semiconductor device layer 106 protruding under the first semiconductor device layer 104. Thus, the portion of the second semiconductor device layer 106 protruding under the first semiconductor device layer 104 is still covered by the first isolation layer 110.

Figure 27:
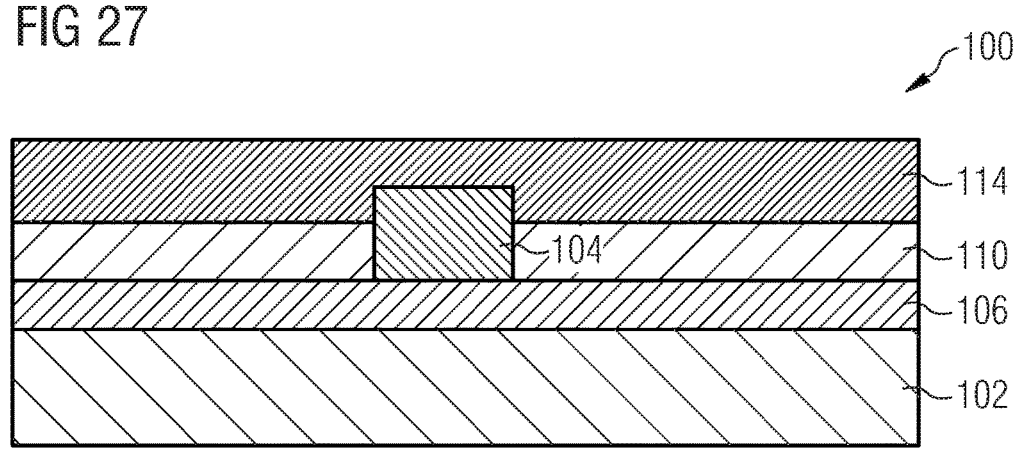
FIG. 27 shows a schematic cross-sectional view of the semiconductor device during manufacturing after the step of providing a first stop layer on the first semiconductor device layer and on the first isolation layer.

FIG. 27 shows a schematic cross-sectional view of the semiconductor device 100 during manufacturing after the step 56 of providing a first stop layer (e.g., etch stop layer) 114 on the first semiconductor device layer 104 and on the first isolation layer 110.

In detail, the first stop layer 114 can be provided on the first semiconductor device layer 104 and on the first isolation layer 110 such that the first stop layer 114 covers the first semiconductor device layer 104 and the first isolation layer 110.

For example, the first stop layer 114 can be a nitride layer. The nitride layer 114 can be deposited on the first semiconductor device layer 104 and on the first isolation layer 110.

Figure 28:
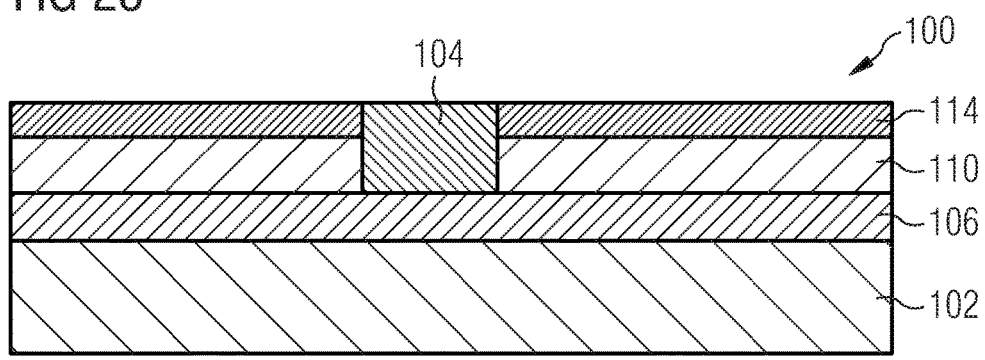
FIG. 28 shows a schematic cross-sectional view of the semiconductor device during manufacturing after the step of planarizing the first stop layer up to the first semiconductor device layer to expose the first semiconductor device layer while maintaining a portion of the first stop layer that is arranged on the first isolation layer.

FIG. 28 shows a schematic cross-sectional view of the semiconductor device 100 during manufacturing after the step 58 of planarizing the first stop layer up to the first semiconductor device layer 104 to expose the first semiconductor device layer 104 while maintaining a portion of the first stop layer 114 that is arranged on the first isolation layer 110.

Figure 29:
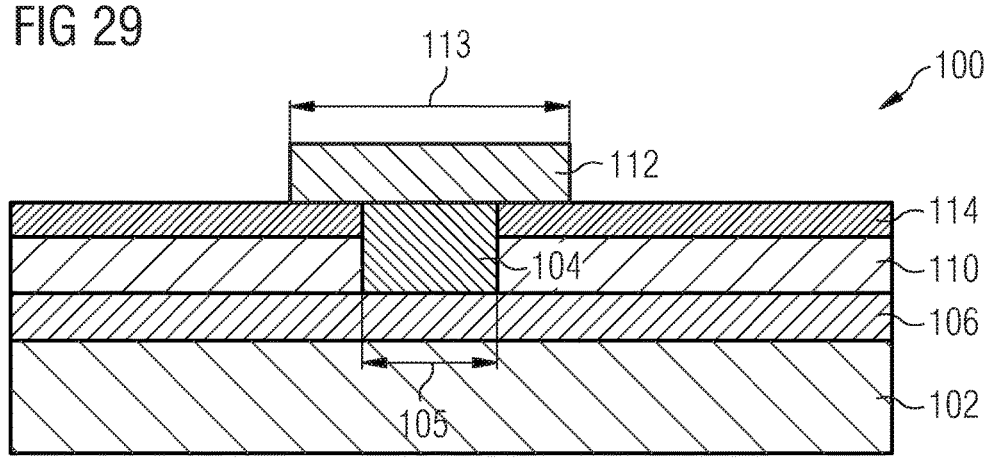
FIG. 29 shows a schematic cross-sectional view of the semiconductor device during manufacturing after the step of providing a first lithographic mask on the first semiconductor device layer, such that the first semiconductor device layer is covered by the first lithographic mask, wherein due to the lithographic minimum feature size also a portion of the first stop layer is covered by the first lithographic mask.

FIG. 29 shows a schematic cross-sectional view of the semiconductor device 100 during manufacturing after the step 60 of providing a first lithographic mask 112 on the first semiconductor device layer 104, such that the first semiconductor device layer 104 is covered by the first lithographic mask 112, wherein due to the lithographic minimum feature size also a portion of the first stop layer 114 is covered by the first lithographic mask 112.

As shown in FIG. 29, due to the lithographic minimum feature size, the lateral size 105 of the first semiconductor device layer 104 is smaller than a lateral size 113 of the first lithographic mask 112. Thus, the first lithographic mask 112 also covers a portion of the first stop layer 114 that is arranged on the first isolation layer 110.

In other words, FIG. 29 shows a schematic cross-sectional view of the semiconductor device 100 during manufacturing after a landing pad lithography step.

Figure 30:
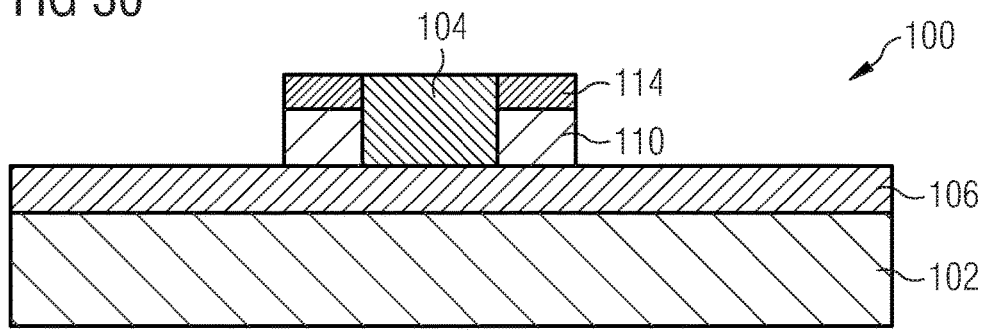
FIG. 30 shows a schematic cross-sectional view of the semiconductor device during manufacturing after the step of selectively removing the first stop layer and the first isolation layer to expose a portion of the second semiconductor device layer while maintaining the portion of the first stop layer and the first isolation layer that are covered by the first lithographic mask, and after removing the first lithographic mask.

FIG. 30 shows a schematic cross-sectional view of the semiconductor device 100 during manufacturing after the step 62 of selectively removing the first stop layer 114 and the first isolation layer 110 to expose a portion of the second semiconductor device layer 106 while maintaining the portion of the first stop layer 114 and the first isolation layer 110 that are covered by the first lithographic mask 112, and after removing the first lithographic mask 112.

In other words, FIG. 30 shows a schematic cross-sectional view of the semiconductor device 100 during manufacturing after a landing pad etch step.

FIG. 31 shows a schematic cross-sectional view of the semiconductor device 100 during manufacturing after the step of providing a second stop layer (e.g., etch stop layer) 115 on the exposed portion of the second semiconductor device layer 106, the maintained portion of the first stop layer 114 and the first semiconductor device layer 104.

For example, the second stop layer 115 can be a nitride layer. The nitride layer 115 can be deposited on the exposed portion of the second semiconductor device layer 106, the maintained portion of the first stop layer 114 and the first semiconductor device layer 104.

FIG. 32 shows a schematic cross-sectional view of the semiconductor device 100 during manufacturing after the step of providing a second isolation layer 116 on the second stop layer 115 such that the second stop layer 115 is covered by the second isolation layer 116.

For example, the second isolation layer 116 can be an ILD (ILD=inter-layer dielectric) layer 116, e.g., a contact ILD layer. The ILD layer 116 can be deposited on the second stop layer 115, such that the second stop layer 115 is covered by the ILD layer 116.

Further, the second isolation layer 116 can be planarized.

In other words, FIG. 32 shows a schematic cross-sectional view of the semiconductor device 100 during manufacturing after an ILD depositing and planarizing step.

FIG. 33 shows a schematic cross-sectional view of the semiconductor device 100 during manufacturing after the step of providing a second lithographic mask 118 on the second isolation layer 116 defining contact holes 120 and 122 (through the isolation layer 116 and the second stop layer 115) for contacting the at least two semiconductor device layers 104 and 106, and after the step of selectively removing the second isolation layer 116 up to the second stop layer 115, while maintaining portions of the second isolation layer 116 that are covered by the second lithographic mask 118, to obtain the contact holes 120 and 122.

In detail, as shown in FIG. 33, the second lithographic mask 118 may define a first contact hole 120 through the second isolation layer 116 and the second stop layer 115 for contacting the first semiconductor device layer 104, and a second contact hole 122 through the second isolation layer 116 and the second stop layer 115 for contacting the second semiconductor device layer 106.

For example, the second isolation layer 116 can be removed by an etch process with stop on the second stop layer (e.g., etch stop layer) 115.

Further, as shown in FIG. 33, due to the lithographic minimum feature size a lateral size 124 and 126 of the contact holes 120 and 126 is greater than a lateral size 105 of the first semiconductor device layer 104.

In other words, FIG. 33 shows a schematic cross-sectional view of the semiconductor device 100 during manufacturing after a contact lithography step and an ILD etch step.

Figure 34:
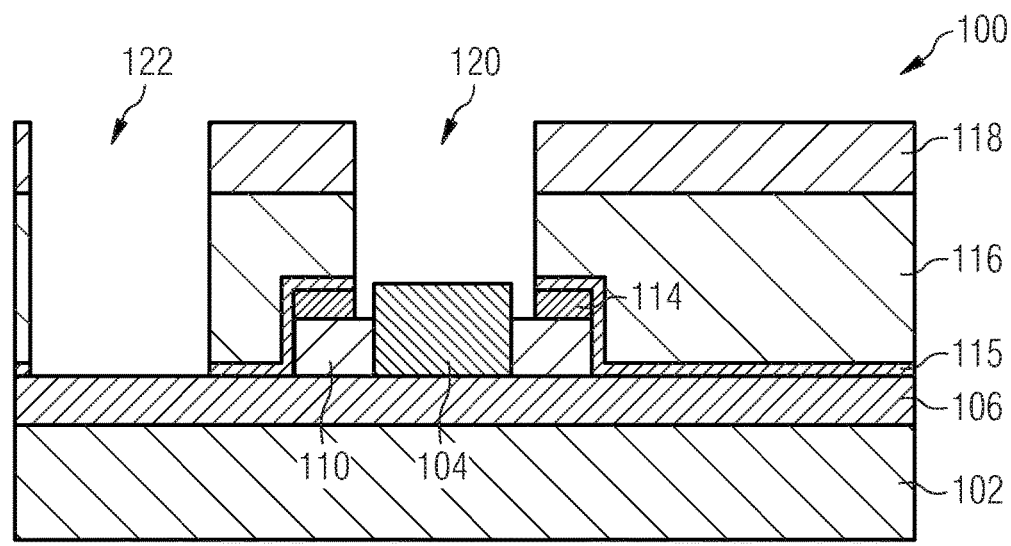
FIG. 34 shows a schematic cross-sectional view of the semiconductor device during manufacturing after the step of selectively removing the second stop layer that is exposed in the contact holes up to the first semiconductor device layer and up to the second semiconductor device layer.

FIG. 34 shows a schematic cross-sectional view of the semiconductor device 100 during manufacturing after the step of selectively removing the second stop layer 115 that is exposed in the contact holes 120 and 122 up to the first semiconductor device layer 104 and up to the second semiconductor device layer 106.

In detail, the second stop layer 115 that is exposed in the first contact hole 120 can be removed up to the first semiconductor device layer 104 such that the first semiconductor device layer 104 is exposed in the first contact hole 120. Further, the second stop layer 115 that is exposed in the second contact hole 122 can be removed up to the second semiconductor device layer 106 such that the second semiconductor device layer 106 is exposed in the second contact hole 122.

For example, the second stop layer 115 (e.g., a nitride layer) can be removed by an etch process.

Figure 35:
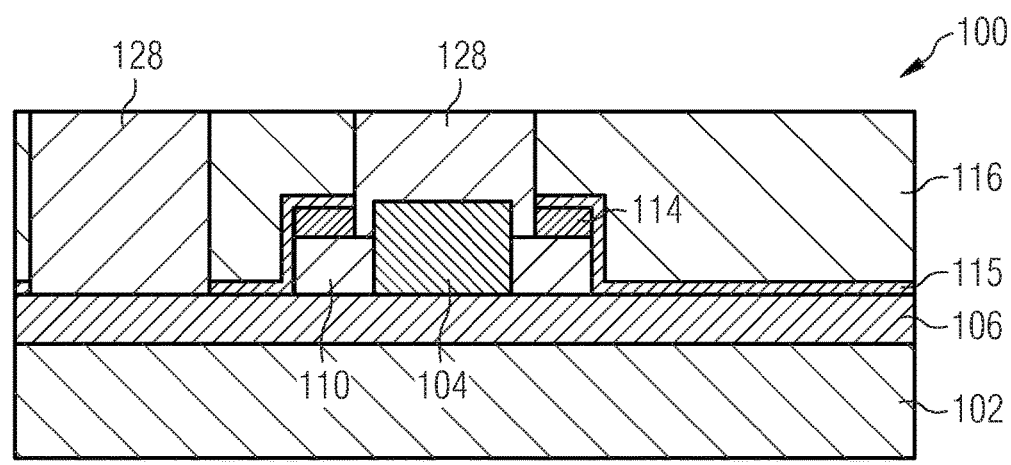
FIG. 35 shows a schematic cross-sectional view of the semiconductor device during manufacturing after the step of filling the contact holes with contact material thereby contacting the first semiconductor device layer and the second semiconductor device layer.

FIG. 35 shows a schematic cross-sectional view of the semiconductor device 100 during manufacturing after the step of filling the contact holes 120 and 122 with contact material 128 thereby contacting the first semiconductor device layer 104 and the second semiconductor device layer 106.

The contact material 128 can be, for example, tungsten. Naturally, also any other material suitable for contacting a semiconductor material may be used.

The above described embodiments can be used, for example, for contacting an emitter electrode and base electrode of a heterojunction bipolar transistor (HBT), as will become clear from the discussion of FIGS. 36 to 52, which show cross-sectional views of the semiconductor device after different manufacturing steps.

As will become clear from the following discussion, one or more embodiments may solve the problem of contacting of the HBT emitter in case it is smaller than the contact size available by the litho. The HBT and in particular its emitter can be shrunk by using various inner spacers and thus can easily become smaller than the available contact critical dimensions. Contacting such structures by the contacts larger than they themselves is nearly impossible and can cause shorts.

One or more embodiments may solve that problem by creating an auxiliary dielectric landing pad that enables using contacts larger than the HBT structure itself. Also overlay tolerances of the litho process are strongly reduced allowing to disable the tool dedication and usage of any available litho tool. Further, the process window for the contact lithography is significantly widened.

Thereby, the self-aligned landing pad allows contacting the semiconductor device in the areas of protruding topography, e.g., HBT emitter.

Figure 36:
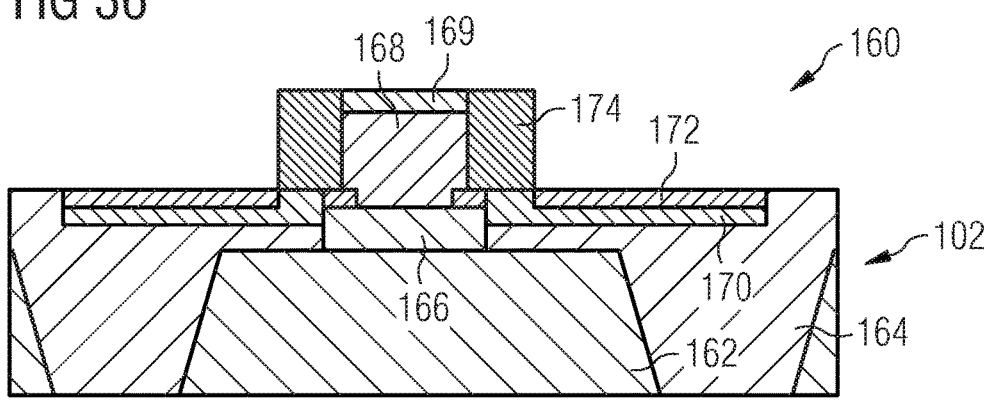
FIG. 36 shows a schematic cross-sectional view of a HBT during manufacturing after the step of providing a semiconductor substrate having a HBT layer stack.

FIG. 36 shows a schematic cross-sectional view of a HBT during manufacturing after the step of providing a semiconductor substrate 102 having a HBT layer stack 160. The HBT layer stack 160 comprises a collector layer 162 formed in the semiconductor substrate 102 by trenches 164, a base layer 166 arranged on the collector layer 162 and an emitter layer 168 arranged on the base layer 166, wherein the emitter layer 168 is covered by silicide 169. Further, the HBT layer stack 160 comprises base electrodes 170 contacting the base layer 166, wherein the base electrodes 170 are covered by silicide 172. Further, the HBT layer stack 160 comprises lateral spacers 174 arranged on sidewalls of the emitter layer 168.

In other words, FIG. 36 shows a readily processed HBT Transistor after the basis electrode and emitter surfaces had been silicided. The outer sidewalls of the emitter are protected by oxide layers left from emitter spacer. Due to lateral shrinking of the HBT it may happen that the lateral size of the emitter is significantly smaller than that of the smallest contact available by the lithography.

Figure 37:
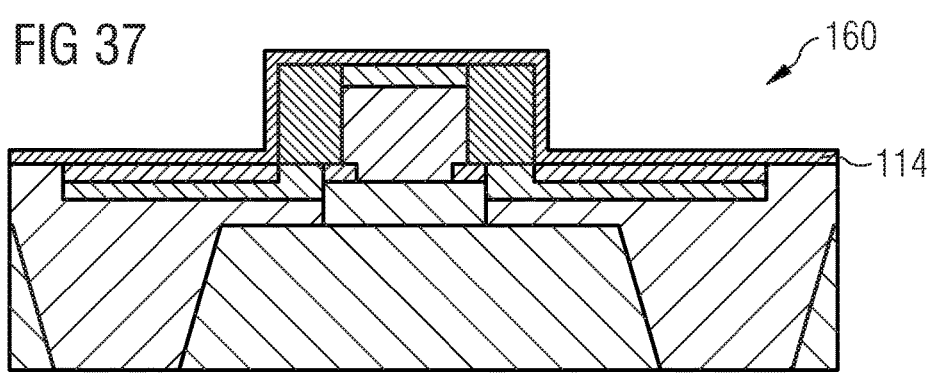
FIG. 37 shows a schematic cross-sectional view of a HBT during manufacturing after the step of providing a first stop layer on the HBT layer stack, such that the HBT layer stack is covered with the first stop layer.

FIG. 37 shows a schematic cross-sectional view of a HBT 160 during manufacturing after the step of providing a first stop layer 114 on the HBT layer stack 160, such that the HBT layer stack 160 is covered with the first stop layer 114.

For example, the first stop layer 114 can be a contact etch stop layer (CESL) that can be deposited.

Figure 38:
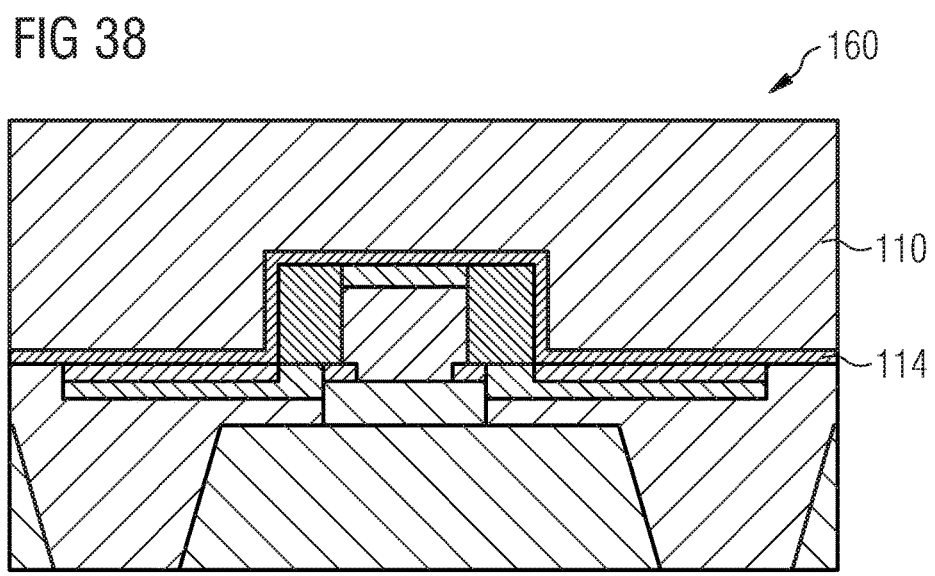
FIG. 38 shows a schematic cross-sectional view of a HBT during manufacturing after the step of providing a first isolation layer on the first stop layer, such that the first stop layer is covered by the first isolation layer.

FIG. 38 shows a schematic cross-sectional view of a HBT 160 during manufacturing after the step of providing a first isolation layer 110 on the first stop layer 114, such that the first stop layer 114 is covered by the first isolation layer 110.

For example, the first isolation layer 110 can be an ILD (ILD=inter-layer dielectric) that can be deposited.

Figure 39:
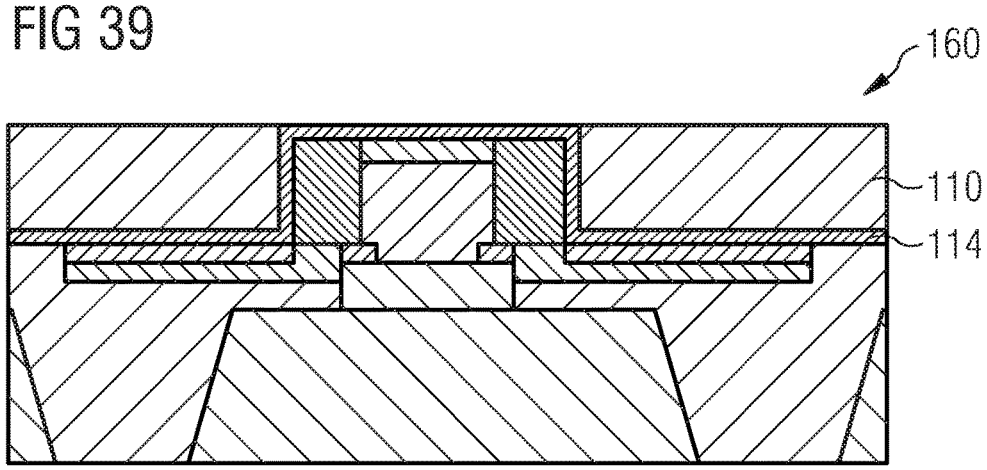
FIG. 39 shows a schematic cross-sectional view of a HBT during manufacturing after the step of planarizing the first isolation layer up to the first stop layer, such that the first stop layer above the emitter of the HBT is exposed.

FIG. 39 shows a schematic cross-sectional view of a HBT 160 during manufacturing after the step of planarizing the first isolation layer 110 up to the first stop layer 114, such that the first stop layer above the emitter 168 of the HBT is exposed.

For example, the preliminary ILD can be planarized to the transistor topology by means of CMP (CMP=chemical mechanical polishing). CESL 114 serves here as a polish stop.

Figure 40:
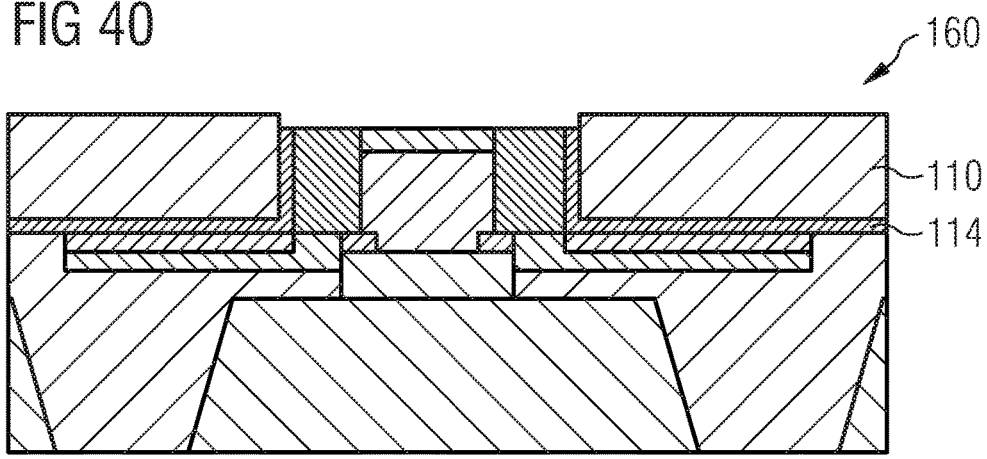
FIG. 40 shows a schematic cross-sectional view of a HBT during manufacturing after the step of selectively removing the first stop layer up to the emitter layer, such that the emitter layer is exposed.

FIG. 40 shows a schematic cross-sectional view of a HBT 160 during manufacturing after the step of selectively removing the first stop layer 114 up to (the silicide 169 of) the emitter layer 168, such that (the silicide 169 of) the emitter layer 168 is exposed.

For example, the nitride on top of the emitter can be opened by means of either dry or wet etching.

Figure 41:
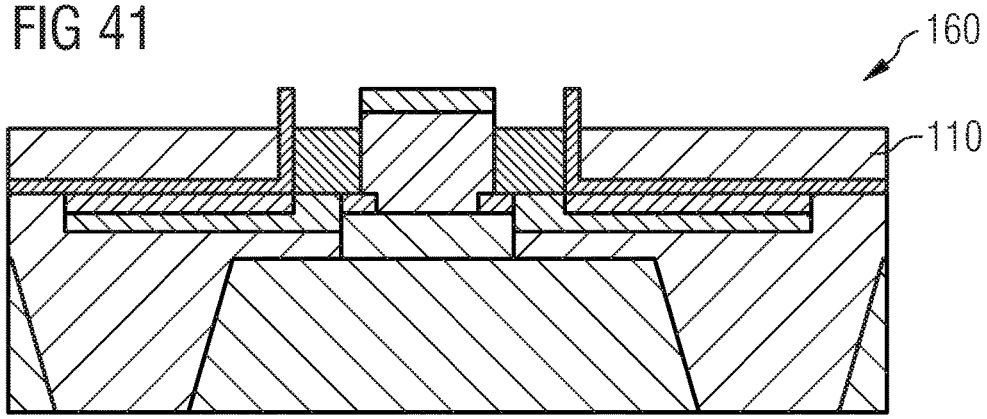
FIG. 41 shows a schematic cross-sectional view of a HBT during manufacturing after the step of recessing the first isolation layer.

FIG. 41 shows a schematic cross-sectional view of a HBT 160 during manufacturing after the step of recessing the first isolation layer 110.

For example, the preliminary ILD can be etched to a defined depth by means of dry etching.

FIG. 42 shows a schematic cross-sectional view of a HBT 160 during manufacturing after the step of providing a second stop layer 115 on the first isolation layer 110 and (the silicide 169 of) the emitter layer 168.

For example, a thick etch contact etch stop layer 115 can be deposited. The thickness of this layer is larger than that of the first CESL 114. The etched preliminary ILD 110 has to be completely filled with this film.

FIG. 43 shows a schematic cross-sectional view of a HBT 160 during manufacturing after the step of planarizing the second stop layer 115 up to (the silicide 169 of) the emitter layer 168, such that that (the silicide 169 of) the emitter layer 168 is exposed.

For example, the thick CESL 115 can be planarized to the level of the emitter. It does not necessarily have to open the silicide, but the remaining thickness on top has to be less than that of the first CESL 114. Such planarization is naturally achieved by elevated pressure in the regions with protruding topographies. Thus, the critical structure is now surrounded by a thick layer that will stop the contact etching later on.

FIG. 44 shows a schematic cross-sectional view of a HBT 160 during manufacturing after the step of providing a first lithographic mask 112 on (the silicide 169 of) the emitter 168, such that (the silicide 169 of) the emitter 168 is covered by the first lithographic mask 112.

As shown in FIG. 44, due to the lithographic minimum feature size (due to which the lateral size of the emitter layer is smaller than a lateral size of the first lithographic mask 112) also a portion of the second stop layer 115 is covered by the first lithographic mask 112.

For example, a litho mask can be applied to define the landing area of the critical contacts.

FIG. 45 shows a schematic cross-sectional view of a HBT 160 during manufacturing after the step of removing the second stop layer 115 while maintaining the silicide 169 of the emitter 168 and a portion of the second stop layer 115 that are covered by the first lithographic mask 112.

For example, the thick CESL 115 can be removed in the regions where it is open by means of dry or wet etching.

FIG. 46 shows a schematic cross-sectional view of a HBT 160 during manufacturing after the step of removing the first lithographic mask 112.

FIG. 47 shows a schematic cross-sectional view of a HBT 160 during manufacturing after the step of providing a second isolation layer 116 on the first isolation layer 110, (the silicide 169 of) the emitter 168 and the maintained portion of the second stop layer 115.

For example, the regular contact ILD can be deposited.

FIG. 48 shows a schematic cross-sectional view of a HBT 160 during manufacturing after the step of providing a second lithographic mask 118 on the second isolation layer 116, the second lithographic mask 118 defining contact holes for contacting (the silicide 169 of) the emitter layer 168 and (the silicide 172 of) the base electrode 170.

For example, the contact mask can be applied.

FIG. 49 shows a schematic cross-sectional view of a HBT 160 during manufacturing after the step of removing the second isolation layer 116 up to the first stop layer 114, while maintaining a portion for the second isolation layer that is covered by the second lithographic mask 118.

For example, the contact ILD can be etched. The etch stops at the first CESL 114.

FIG. 50 shows a schematic cross-sectional view of a HBT 160 during manufacturing after the step of removing the first stop layer that is exposed in the contact holes up to (the silicide 169 of) the emitter layer 168 and up to (the silicide 172 of) the base electrode 170.

For example, the CESL can be etched now. The thinner first CESL can be opened and the etch stops at the silicide. The thicker second CESL around the critical structure is yet not completely etched and the contact etch is blocked. Thus the contact will not punch through to the surrounding structures causing a short circuit.

FIG. 51 shows a schematic cross-sectional view of a HBT 160 during manufacturing after the step of selectively removing the second lithographic mask 118.

FIG. 52 shows a schematic cross-sectional view of a HBT 160 during manufacturing after the step of filling the contact holes with contact material 128.

For example, the metallization can be completed.

Further embodiments provide a semiconductor device. The semiconductor device comprises at least two semiconductor device layers, wherein a first semiconductor device layer of the at least two semiconductor device layers is arranged on a second semiconductor device layer of the at least two semiconductor device layers that protrudes under the first semiconductor device layer. Further, the semiconductor device comprises lateral isolation spacers that are arranged on sidewalls of the first semiconductor device layer. Further, the semiconductor device comprises contacts contacting the first semiconductor device layer and the second semiconductor device layer. Thereby, a lateral size of the contacts is greater than a lateral size of the first semiconductor device layer.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:
1. A method for manufacturing, the method comprising:
providing a semiconductor substrate having a semiconductor device, wherein the semiconductor device comprises at least two semiconductor device layers to be contacted, the at least two semiconductor device layers including a first semiconductor device layer and a second semiconductor device layer;
providing a first isolation layer on the semiconductor device such that the semiconductor device is covered by the first isolation layer;

planarizing the first isolation layer up to the semiconductor device;

providing a first lithographic mask on the semiconductor device, such that the first semiconductor device layer is covered by the first lithographic mask, wherein a portion of the first isolation layer is covered by the first lithographic mask;

selectively removing the first isolation layer to expose a second semiconductor device layer of the at least two semiconductor device layers while maintaining the portion of the first isolation layer that is covered by the first lithographic mask; and subsequent to selectively removing the first isolation layer, providing a stop layer on the first semiconductor device layer, the second semiconductor device layer, and the portion of the first isolation layer.

2. The method according to claim 1, wherein a lateral size of the first lithographic mask is greater than a lateral size of the first semiconductor device layer.

3. The method according to claim 1, wherein providing the first isolation layer on the semiconductor device includes covering the first semiconductor device layer and the second semiconductor device layer with the first isolation layer.

4. The method according to claim 1, wherein providing the first isolation layer on the semiconductor device includes covering the first semiconductor device layer and the second semiconductor device layer entirely with the first isolation layer.

5. The method according to claim 1, wherein the first semiconductor device layer is disposed on the second semiconductor device layer and has smaller lateral dimension than a lateral dimension of the second semiconductor device layer.

6. The method according to claim 1, wherein a lateral size of the first semiconductor device layer is smaller than a lateral size of the second semiconductor device layer and a lateral size of the first lithographic mask, and the lateral size of the second semiconductor device layer is greater than the lateral size of the first lithographic mask.

7. The method according to claim 1, wherein the first semiconductor device layer of the at least two semiconductor device layers is smaller than a lithographic minimum feature size used for manufacturing the semiconductor device.

8. The method according to claim 7, wherein the lithographic minimum feature size is a critical dimension of a lithography process used for manufacturing the semiconductor device, the lithography process including providing the first lithographic mask on the semiconductor device.

9. A method for manufacturing, the method comprising:
providing a semiconductor substrate having a semiconductor device, wherein the semiconductor device comprises at least two semiconductor device layers to be contacted, the at least two semiconductor device layers including a first semiconductor device layer and a second semiconductor device layer;

providing a first isolation layer on the semiconductor device such that the semiconductor device is covered by the first isolation layer;

planarizing the first isolation layer up to the semiconductor device;

providing a first lithographic mask on the semiconductor device, such that the first semiconductor device layer is covered by the first lithographic mask, wherein a portion of the first isolation layer is covered by the first lithographic mask;

selectively removing the first isolation layer to expose a second semiconductor device layer of the at least two semiconductor device layers while maintaining the portion of the first isolation layer that is covered by the first lithographic mask;

providing a stop layer on the first semiconductor device layer, the second semiconductor device layer and the portion of the first isolation layer; and providing a second isolation layer on the stop layer, such that the stop layer is covered by the second isolation layer.

10. The method according to claim 9, wherein the method comprises:
providing a second lithographic mask on the second isolation layer defining contact holes for contacting the at least two semiconductor device layers, wherein a lateral size of each of the contact holes is greater than a lateral size of the first semiconductor device layer.

11. The method according to claim 10, wherein the method comprises:
selectively removing the second isolation layer up to the stop layer while maintaining portions of the second isolation layer covered by the second lithographic mask, to obtain the contact holes.

12. The method according to claim 11, wherein the method comprises:
selectively removing the stop layer that is exposed in the contact holes up to the first semiconductor device layer and up to the second semiconductor device layer.

13. The method according to claim 12, wherein the method comprises:
filling the contact holes with contact material thereby contacting the first semiconductor device layer and the second semiconductor device layer.

14. The method according to claim 9, wherein the first semiconductor device layer of the at least two semiconductor device layers is smaller than a lithographic minimum feature size used for manufacturing the semiconductor device.

15. The method according to claim 14, wherein the lithographic minimum feature size is a critical dimension of a lithography process used for manufacturing the semiconductor device, the lithography process including providing the first lithographic mask on the semiconductor device.

16. A method for manufacturing, the method comprising:
providing a semiconductor substrate having a semiconductor device, wherein the semiconductor device comprises at least two semiconductor device layers to be contacted, the at least two semiconductor device layers including a first semiconductor device layer and a second semiconductor device layer;

providing a first isolation layer on the semiconductor device such that the semiconductor device is covered by the first isolation layer;

planarizing the first isolation layer up to the semiconductor device;

providing a first lithographic mask on the semiconductor device, such that the first semiconductor device layer is covered by the first lithographic mask, wherein a portion of the first isolation layer is covered by the first lithographic mask;

selectively removing the first isolation layer to expose a second semiconductor device layer of the at least two semiconductor device layers while maintaining the portion of the first isolation layer that is covered by the first lithographic mask; and providing a stop layer on the first semiconductor device layer, the second semiconductor device layer and the portion of the first isolation layer;

wherein the first semiconductor device layer is arranged on the second semiconductor device layer, and wherein the second semiconductor device layer protrudes under the first semiconductor device layer.

17. The method according to claim 16, wherein the first semiconductor device layer of the at least two semiconductor device layers is smaller than a lithographic minimum feature size used for manufacturing the semiconductor device.

18. The method according to claim 17, wherein the lithographic minimum feature size is a critical dimension of a lithography process used for manufacturing the semiconductor device, the lithography process including providing the first lithographic mask on the semiconductor device.

* * * * *